US008834956B2

(12) United States Patent
Sills et al.

(10) Patent No.: US 8,834,956 B2
(45) Date of Patent: Sep. 16, 2014

(54) METHODS OF UTILIZING BLOCK COPOLYMER TO FORM PATTERNS

(75) Inventors: Scott Sills, Boise, ID (US); Dan Millward, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 715 days.

(21) Appl. No.: 12/489,188

(22) Filed: Jun. 22, 2009

(65) Prior Publication Data

US 2010/0323096 A1    Dec. 23, 2010

(51) Int. Cl.
  *H05K 3/00*    (2006.01)
  *B05D 5/12*    (2006.01)
  *H01L 21/033*  (2006.01)
  *B81C 1/00*    (2006.01)
  *B05D 1/18*    (2006.01)

(52) U.S. Cl.
  CPC ..... *H01L 21/0337* (2013.01); *B81C 2201/0149* (2013.01); *B81C 1/00031* (2013.01); *B05D 1/185* (2013.01)
  USPC ........... 427/96.1; 427/58; 427/98.4; 427/271; 427/272

(58) Field of Classification Search
  USPC .......................................................... 427/58
  See application file for complete search history.

(56) References Cited

U.S. PATENT DOCUMENTS

| 6,518,194 | B2 | 2/2003 | Winningham et al. |
| 6,893,705 | B2 | 5/2005 | Thomas et al. |
| 7,189,435 | B2 | 3/2007 | Tuominen et al. |
| 7,347,953 | B2 | 3/2008 | Black et al. |
| 7,803,517 | B2 | 9/2010 | Park et al. |
| 2001/0003364 | A1* | 6/2001 | Sugawara et al. ............. 257/192 |
| 2007/0175859 | A1* | 8/2007 | Black et al. ..................... 216/41 |
| 2008/0038467 | A1 | 2/2008 | Jagannathan et al. |
| 2008/0193658 | A1 | 8/2008 | Millward |
| 2008/0290067 | A1* | 11/2008 | Yoshida et al. ................. 216/49 |
| 2008/0299353 | A1* | 12/2008 | Stoykovich et al. ........ 428/195.1 |
| 2009/0233236 | A1* | 9/2009 | Black et al. ..................... 430/311 |

FOREIGN PATENT DOCUMENTS

WO    WO 2007/127496    11/2007

OTHER PUBLICATIONS

Sundrani et al. (Guiding polymers to perfection: macroscopic alignment of nanoscale domains) Dec. 2003.*
PCT/US2010/037132, Jan. 4, 2011, Written Opinion.
PCT/US2010/037132, Jan. 4, 2011, Search Report.
PCT/US2010/037132, Jan. 4, 2012, IPRP.

* cited by examiner

*Primary Examiner* — Michael Cleveland
*Assistant Examiner* — Austin Murata
(74) *Attorney, Agent, or Firm* — Wells St. John P.S.

(57)    ABSTRACT

Some embodiments include methods of forming patterns utilizing copolymer. A main body of copolymer may be formed across a substrate, and self-assembly of the copolymer may be induced to form a pattern of structures across the substrate. A uniform thickness throughout the main body of the copolymer may be maintained during the inducement of the self-assembly. In some embodiments, the uniform thickness may be maintained through utilization of a wall surrounding the main body of copolymer to impede dispersal of the copolymer from the main body. In some embodiments, the uniform thickness may be maintained through utilization of a volume of copolymer in fluid communication with the main body of copolymer.

18 Claims, 30 Drawing Sheets

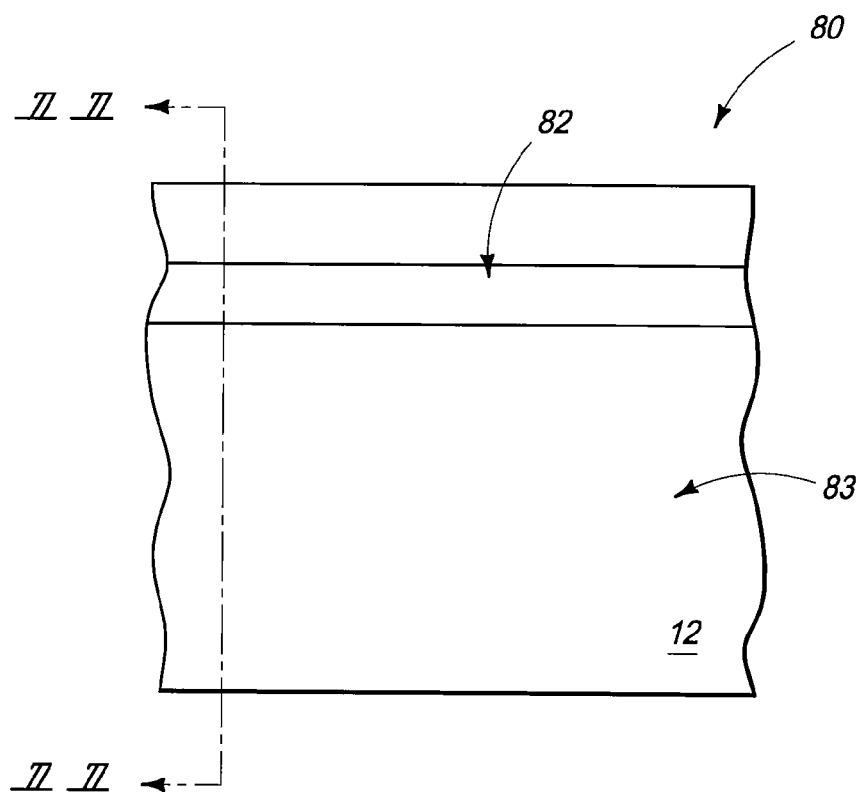
_Fig 10_
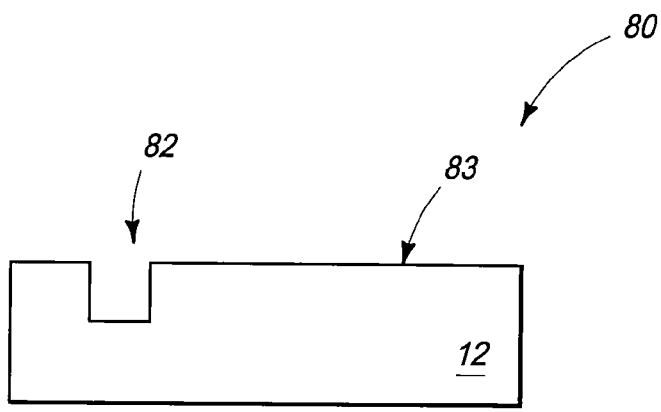
_Fig 11_

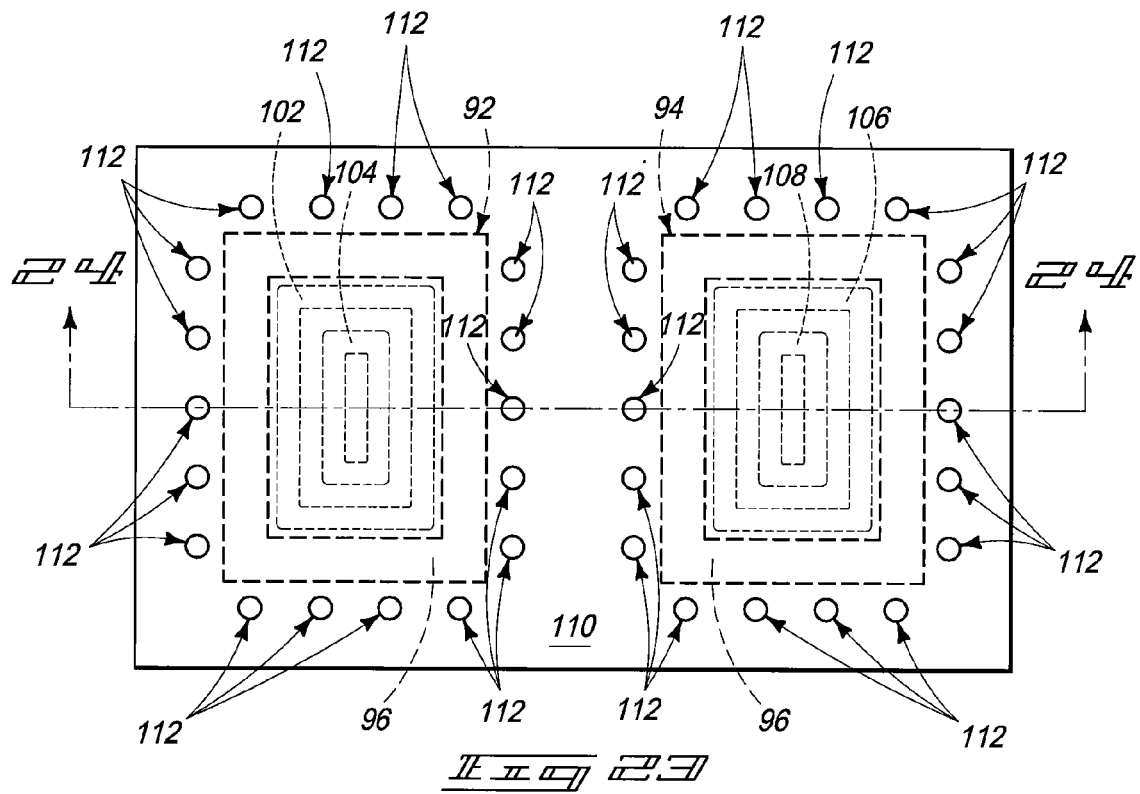
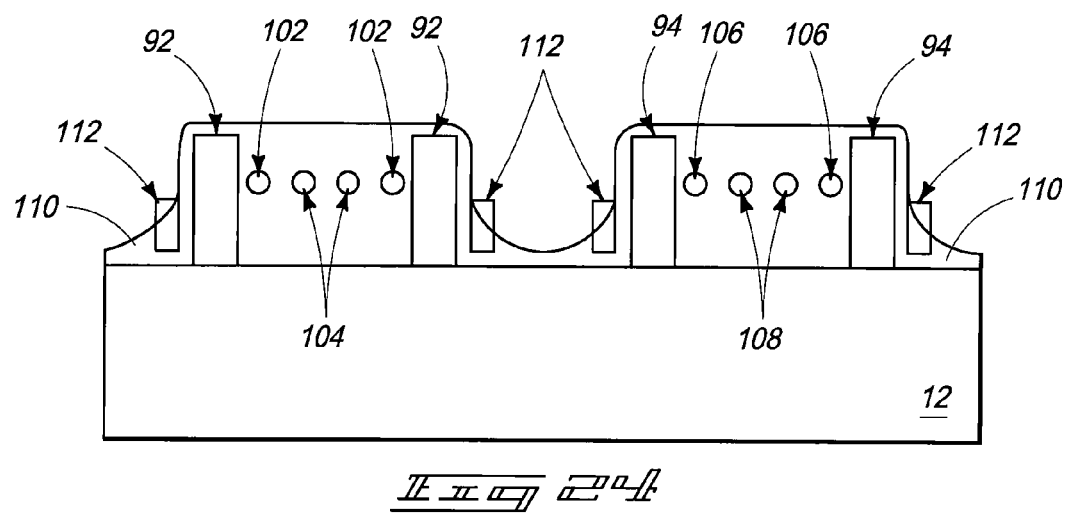

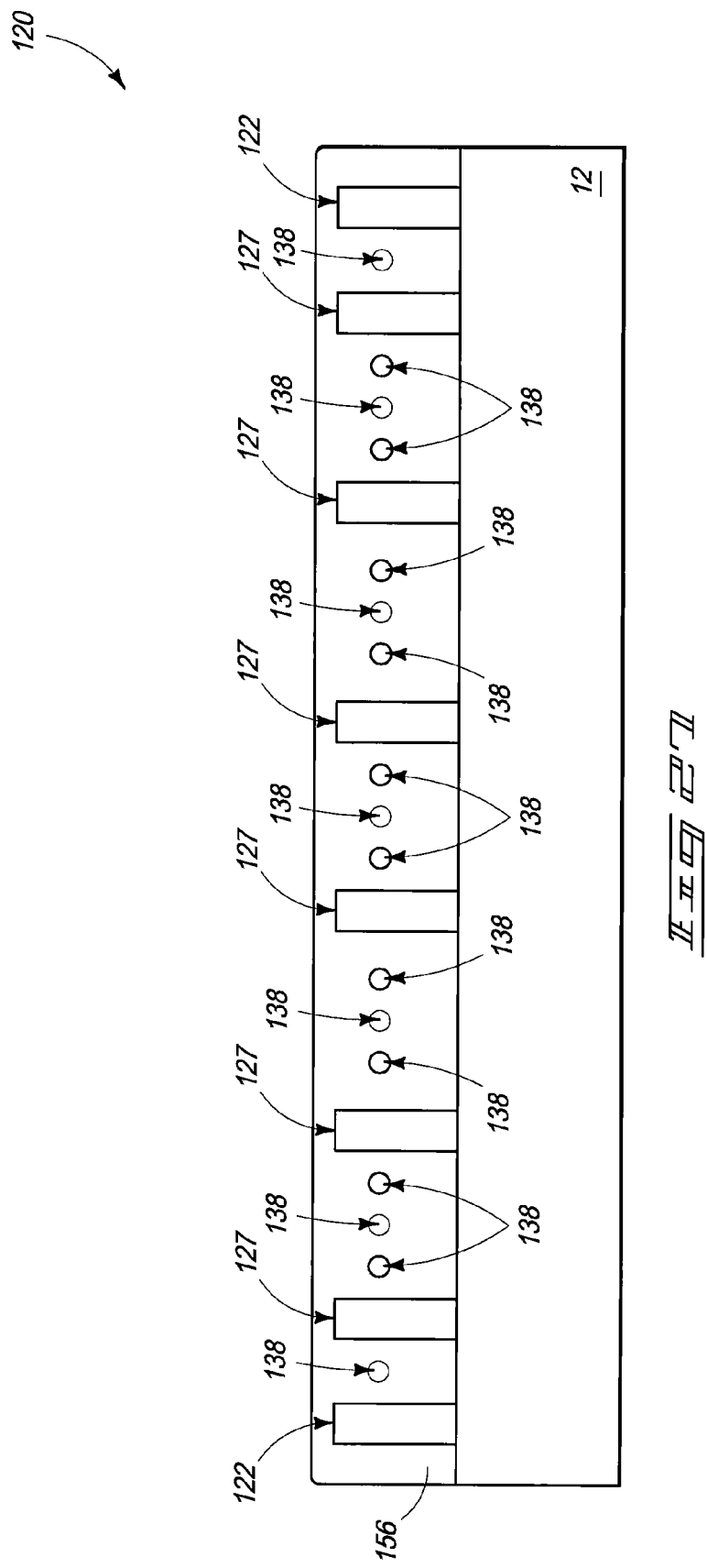

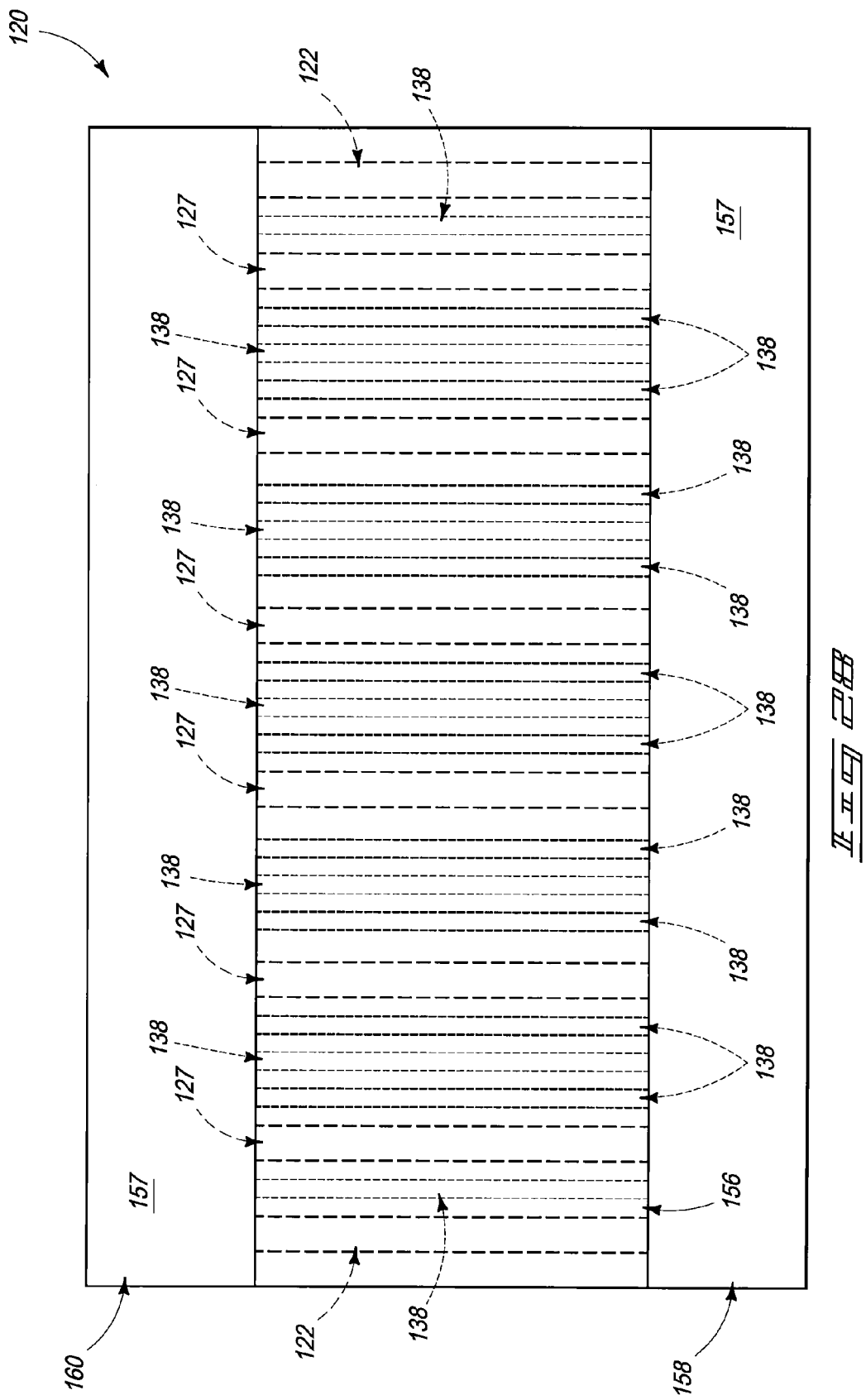

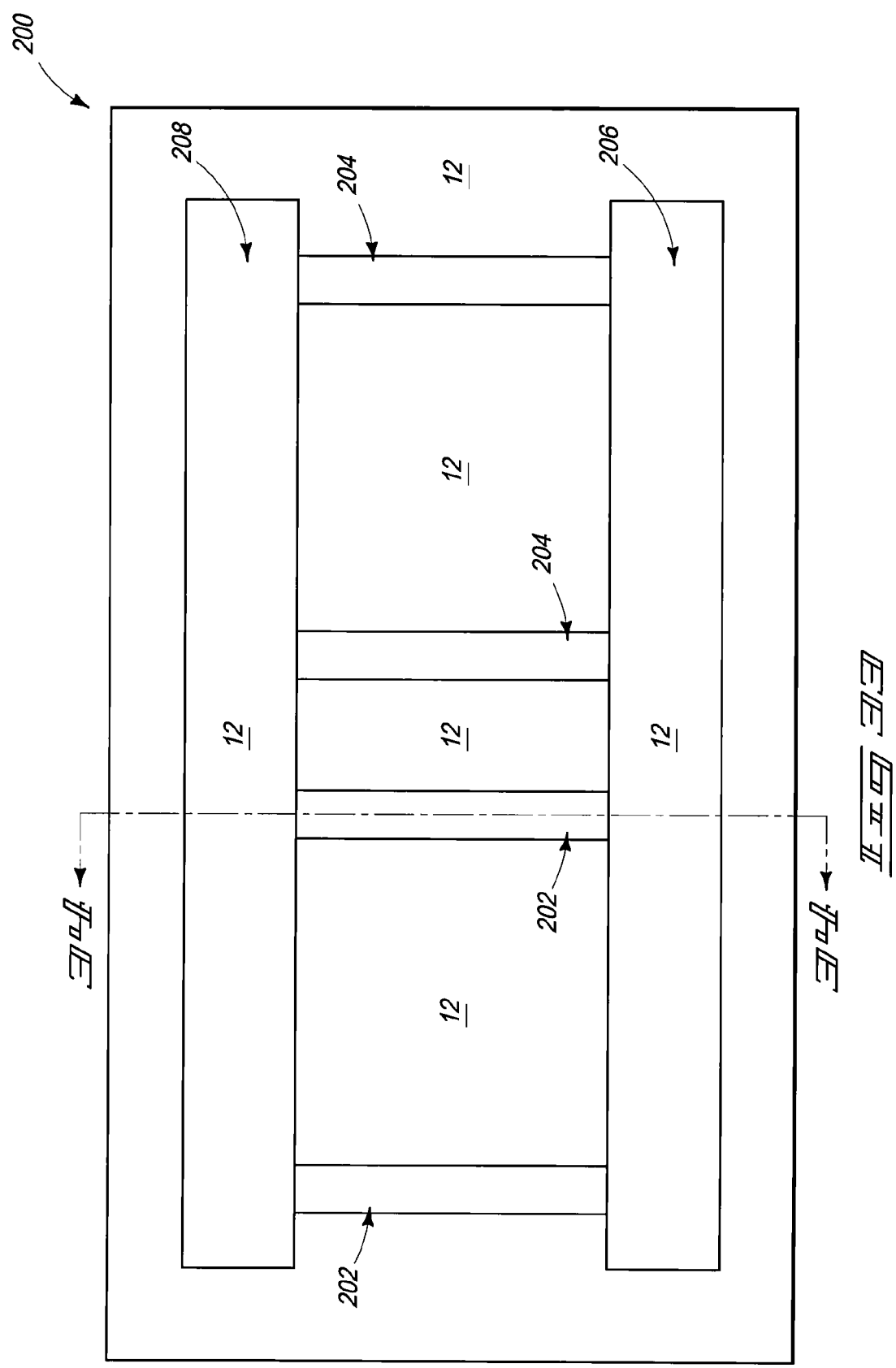

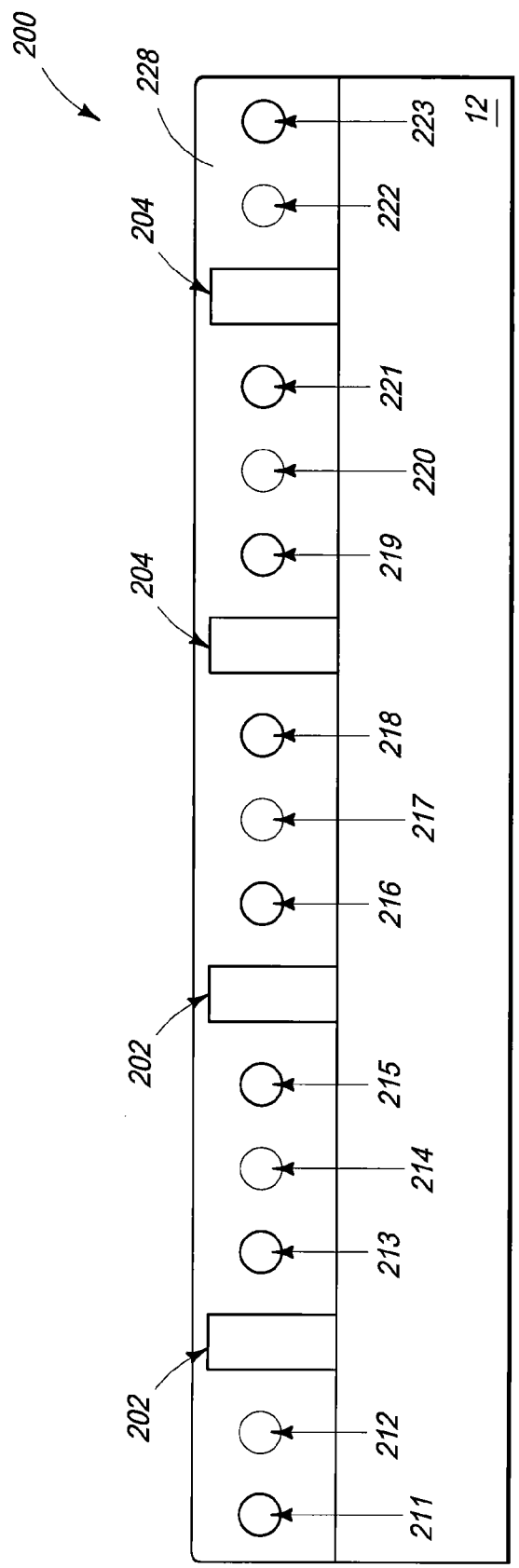

METHODS OF UTILIZING BLOCK COPOLYMER TO FORM PATTERNS

TECHNICAL FIELD

Methods of utilizing copolymers to form patterns.

BACKGROUND

Numerous applications exist in which it is desired to form repeating patterns having a small pitch (for example, a pitch of less than about 50 nanometers). For instance, integrated circuit fabrication may involve formation of a repeating pattern of memory-storage units (i.e., NAND unit cells, dynamic random access memory [DRAM] unit cells, cross-point memory unit cells, etc.).

A variety of methods have been developed for creating patterned masks suitable for patterning underlying materials during fabrication of integrated circuit components. A continuing goal of integrated circuit fabrication is to increase integrated circuit density, and accordingly to decrease the size of individual integrated circuit components. There is thus a continuing goal to form patterned masks having increasing densities of individual features. In cases in which the patterned masks comprise repeating patterns of features, there is a continuing goal to form the repeating patterns to higher density, or in other words, to decrease the pitch.

A method showing some promise for creating repeating patterns to high density involves utilization of a copolymer to form a repeating pattern. Unfortunately, there are often numerous defects present in the repeating patterns formed with copolymers. It would be desirable to develop new methods of forming patterns with copolymers which enable repeating patterns to be formed to high density, and with fewer defects than are presently formed with conventional methods.

BRIEF DESCRIPTION OF THE DRAWINGS

FIGS. 10 and 11 are a diagrammatic top view, and cross-sectional side view, respectively, of a construction at a processing stage of an example embodiment method. The cross-section of FIG. 11 is along the line 11-11 of FIG. 10.

FIGS. 23 and 24 are a diagrammatic top view, and cross-sectional side view, respectively, of the construction of FIGS. 19 and 20 shown at a processing stage subsequent to that of FIGS. 21 and 22. The cross-section of FIG. 24 is along the line 24-24 of FIG. 23.

FIG. 28 is a diagrammatic top view of the construction of FIG. 25 shown at a processing stage subsequent to that of FIG. 26.

FIGS. 32 and 33 are diagrammatic top views of a construction at processing stages of an example embodiment method. The processing stage of FIG. 33 is subsequent to that of FIG. 32.

FIG. 34 is a diagrammatic, cross-sectional view along the line 34-34 of FIG. 33.

FIG. 37 is a diagrammatic, cross-sectional view along the line 37-37 of FIG. 36.

DETAILED DESCRIPTION OF THE ILLUSTRATED EMBODIMENTS

Figure 1:
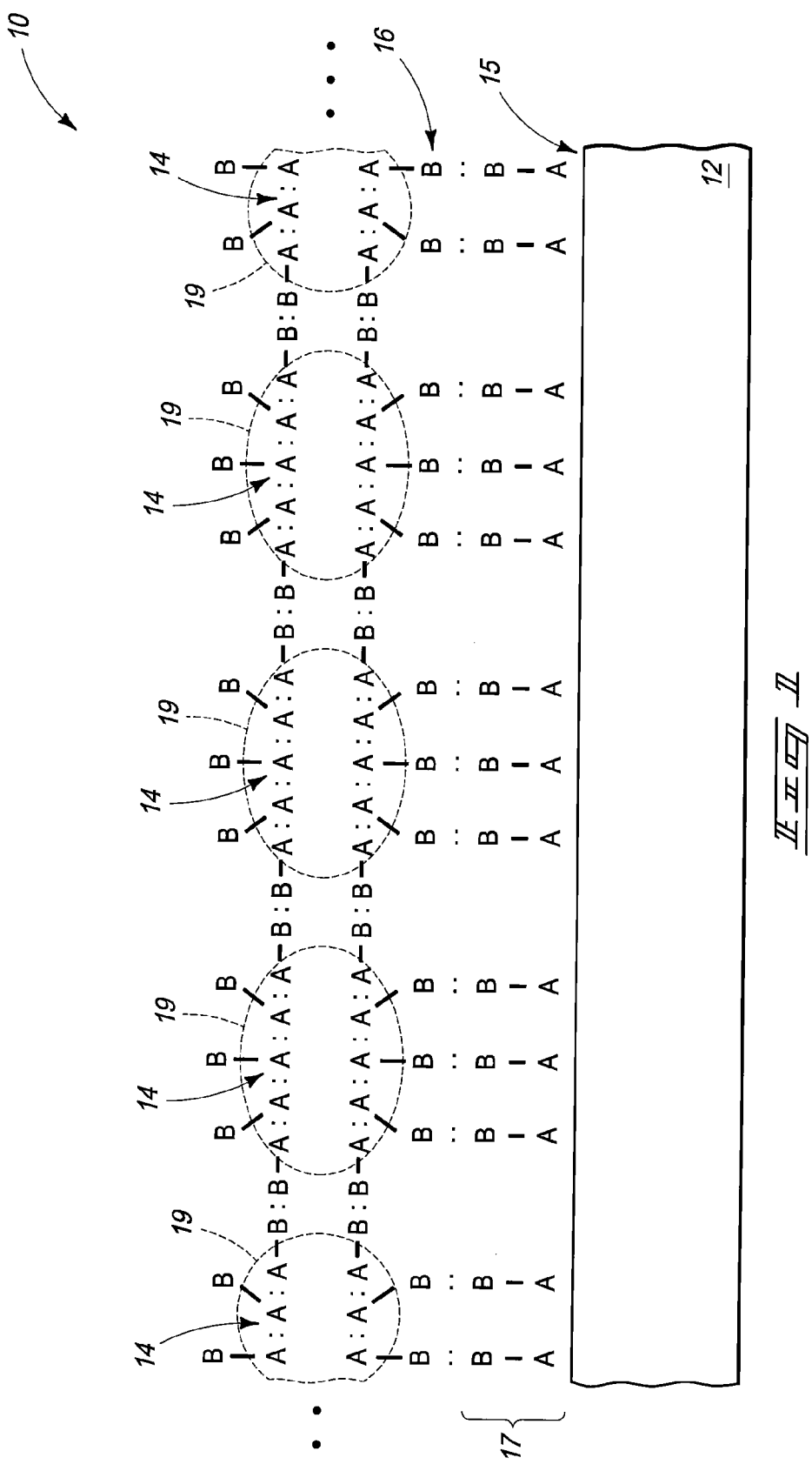
FIG. 1 is a diagrammatic representation of a pattern formed with self-assembly of diblock copolymer.

Copolymers are polymers derived from two or more monomeric species, and contain two or more homopolymer subunits linked by covalent bonds. The union of the homopolymer subunits may utilize an intermediate linkage, known as a junction block.

The embodiments described herein may utilize block copolymers and/or graft copolymers. Block copolymers have the separate homopolymer subunits extending linearly relative to one another to form a single "chain" of the various homopolymer subunits. Graft copolymers are similar to block copolymers, but have one or more of the homopolymer units as a main chain, while having one or more other homopolymer units as side chains connected to the main chain.

Block copolymers may be in the form of diblock copolymers, triblock copolymers, etc. Example diblock copolymers include polystyrene-b-poly (2-vinylpyridine) (PS-b-P2VP); polystyrene-b-poly(ethylene oxide) (PS-b-PEO); polystyrene-b-poly(methylmethacrylate) (PS-b-PMMA); and polystyrene-b-poly(dimethyl-siloxane) (PS-b-PDMS). The "b" utilized in each of the above chemical formulas indicates a block linkage. Diblock copolymers may be generically represented as A-B, where the "A" represents one of the homopolymer subunits, the "B" represents the other of the homopolymer subunits, and the hyphen represents a covalent bond.

The embodiments described herein utilize copolymers to generate patterns over underlying substrates. In some embodiments, the copolymers may be used in compositions containing only one form of copolymer, and in other embodiments the copolymers may be used in compositions containing blends of two or more different copolymers. Example blends may comprise two or more different diblock copolymers that have a common homopolymer subunit (for instance, A-B and B-C), two or more different diblock copolymers that have no common homopolymer subunit, two or more different triblock copolymers that may or may not have a common homopolymer subunit, diblock copolymer mixed with triblock copolymer, graft copolymer mixed with block copolymer, two or more different graft copolymers, etc. In some embodiments, a blend may be formed having copolymer mixed with homopolymer (where the homopolymer corresponds to one or more subunits of the copolymer). The mixing of various copolymers with one another, and/or the mixing of copolymer with homopolymer, may enable tailoring of a copolymer-containing composition so that a desired pattern may be formed during inducement of self-assembly within the composition.

A useful property of some block and graft copolymers is that the homopolymer subunits of the copolymers preferentially interact with like subunits, and avoid interactions with dissimilar subunits. For instance, in some diblock copolymers (A-B), the subunits A preferentially interact with other A, the subunits B preferentially interact with other B, and the subunits A and B preferentially avoid interactions with one another; depending on various factors, such as the length of the blocks, the overall volume fraction of each block, Flory-Huggins interactions, etc. The copolymers may thus self-assemble into repeating patterns. For instance, some copolymers may self-assemble into cylinders having a repeating pattern that may be represented as A-B:B-A:A-B:B-A:A-B. In such pattern, the hyphens represent covalent bonds and the colons represent non-covalent interactions. The self-assembly of copolymers may be utilized to form patterns over substrates.

FIG. 1 shows a construction 10 comprising a substrate 12 having a diblock copolymer pattern extending thereover.

Substrate 12 may comprise, for example, a monocrystalline semiconductor wafer (for example, a monocrystalline silicon wafer), either alone or in assemblies with other materials. The terms "semiconductive substrate" and "semiconductor substrate" as utilized herein mean any constructions comprising semiconductive material, including, but not limited to, bulk semiconductive materials such as semiconductive wafers (either alone or in assemblies comprising other materials thereon), and semiconductive material layers (either alone or in assemblies comprising other materials). The term "substrate" as used herein refers to any supporting structure, including, but not limited to, semiconductive substrates.

The substrate 12 has an upper surface 15 to which subunit A of the diblock copolymer has more affinity than does subunit B of the copolymer, (for instance, surface 15 may be more wettable by subunit A than by subunit B). The diblock copolymer is provided over surface 15 in a solution (or other appropriate mixture) so that the diblock copolymer may assemble in a preferred orientation during subsequent annealing. Accordingly, the diblock copolymer orients so that subunits A are directed toward surface 15. The first layer of A-B copolymer along surface 15 may be referred to as a brush layer 17. Additional levels of A-B copolymer are formed over the brush layer, and self-assembly of the copolymer may be induced by thermal or solvent annealing of the copolymer. In some embodiments, the solvent annealing may correspond to annealing induced with solvent vapor.

The self-assembly has formed a pattern comprising cylinders 14 of A subunits (demarcated by dashed lines 19 in FIG. 1), surrounded by a region 16 of B subunits. The cylinders may extend in and out of the page relative to the cross-sectional view of FIG. 1. Although the surrounding region is shown to be the B subunits and the cylinders are shown to be the A subunits, in other embodiments the pattern may be reversed so that the surrounding region contains the A subunits and the cylinders contain the B subunits. In other embodiments, the subunits "A" or "B" may form spherical micelles instead of cylinders within the surrounding region "B" or "A", respectively.

Figure 2:
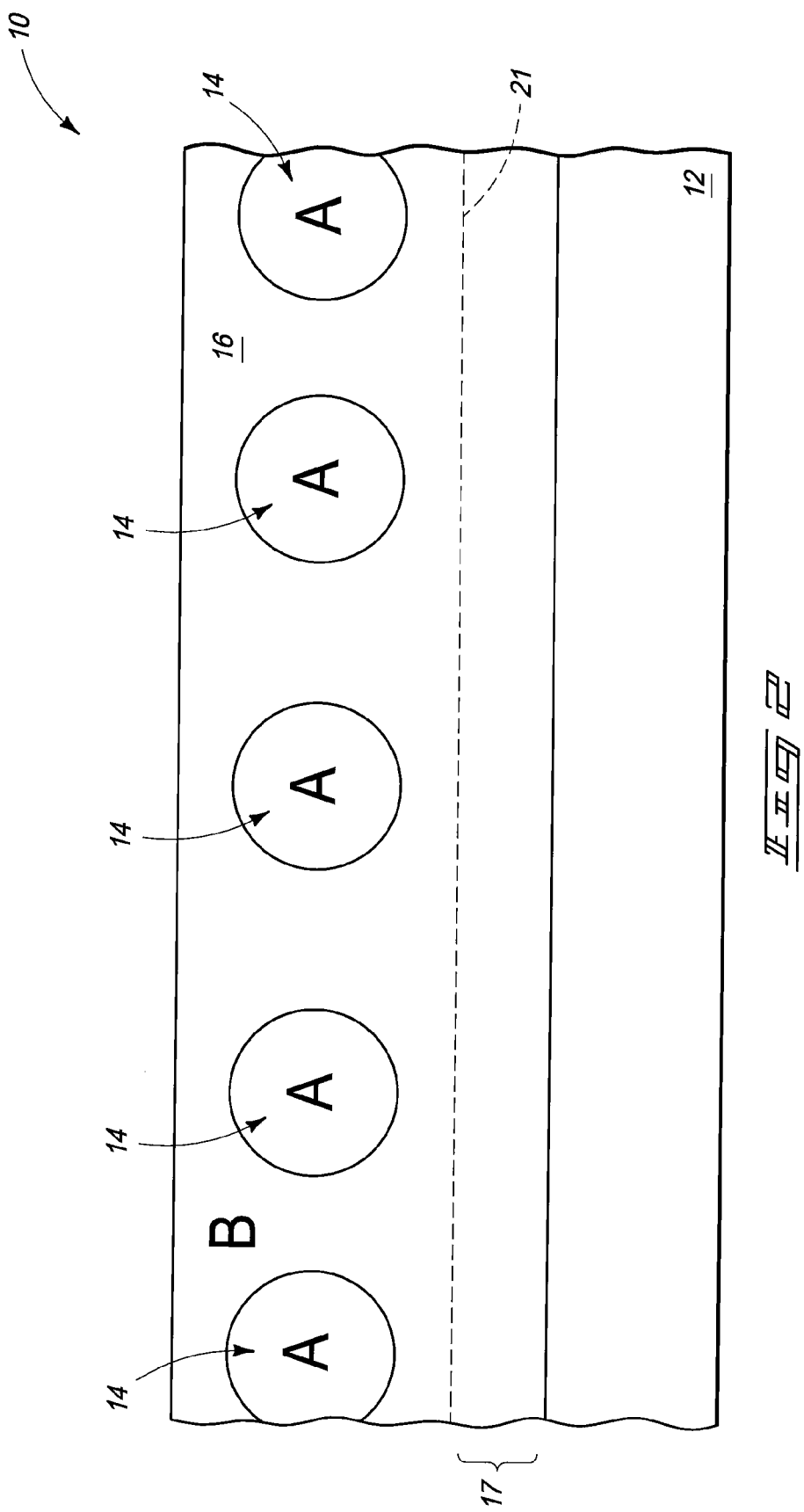
FIG. 2 is another diagrammatic representation of the pattern shown in FIG. 1.

The pattern of FIG. 1 may be diagrammatically represented with the simplified drawing shown in FIG. 2. A boundary between the brush layer 17 and the B subunit region 16 is represented with a dashed line 21 in FIG. 2. The simplified drawing type of FIG. 2 will be used to describe many of the example embodiments presented herein in order to render the description of such embodiments to be more straightforward than would occur if the more complex drawing type of FIG. 1 were utilized.

As mentioned above, the process of forming a pattern with copolymer (for instance, block copolymer and/or graft copolymer) may involve two specific steps. First the copolymer may be spread across a substrate, and second the copolymer may be treated to induce self-assembly of a pattern within the copolymer (the treatment may utilize any process suitable to induce self-assembly within the copolymer, and may utilize, for example, a thermal anneal, a solvent anneal, and/or a process yet to be developed).

Figure 3:
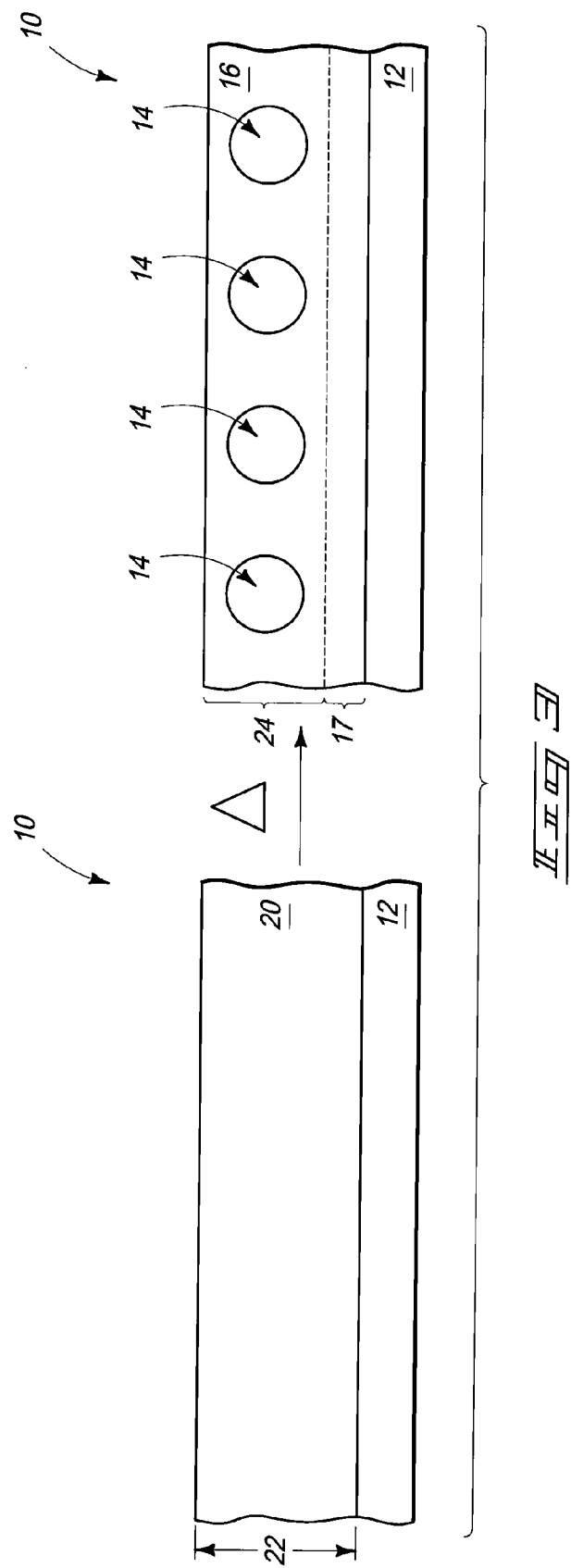
FIG. 3 diagrammatically illustrates thermal treatment of copolymer to induce self-assembly within the copolymer, and shows formation of a desired pattern within the copolymer.

The two steps of forming a pattern with copolymer are illustrated in FIG. 3. An initial step is shown in the left of FIG. 3, where copolymer 20 is provided over substrate 12 to a thickness 22. Heat is then applied to construction 10 (diagrammatically illustrated with the symbol "Δ"), and such thermal treatment provides sufficient molecular mobility to enable micro-phase separation and self-assembly of the copolymer to form the brush layer 17, the cylinders 14, and the surrounding region 16. The cylinders 14 and region 16 are formed to a thickness 24 over the brush layer. Although the specific embodiment shows thermal treatment being applied to induce self-assembly, in this embodiment, and all of the other embodiments described herein, any suitable energy may be applied to induce self-assembly. Thus, any suitable anneal may be used to induce self-assembly, including, for example, a thermal anneal, a solvent anneal, or a technique yet to be developed.

FIG. 3 shows an idealized process in which copolymer 20 is provided over substrate 12 to an appropriate uniform thickness 22 so that self-assembly of the copolymer forms region 16 at a uniform thickness across an entirety of substrate 12. The idealized thickness 22 may be referred to as a commensurate thickness for a monolayer of assembled features 14.

In practice, copolymer 20 may be provided at a thickness other than the idealized thickness 22 of FIG. 3. For instance, FIG. 4 illustrates a situation in which copolymer 20 is provided to a thickness less than the idealized thickness 22, and FIG. 5 illustrates a situation which copolymer 20 is provided to a thickness greater than the idealized thickness 22.

Figure 4:
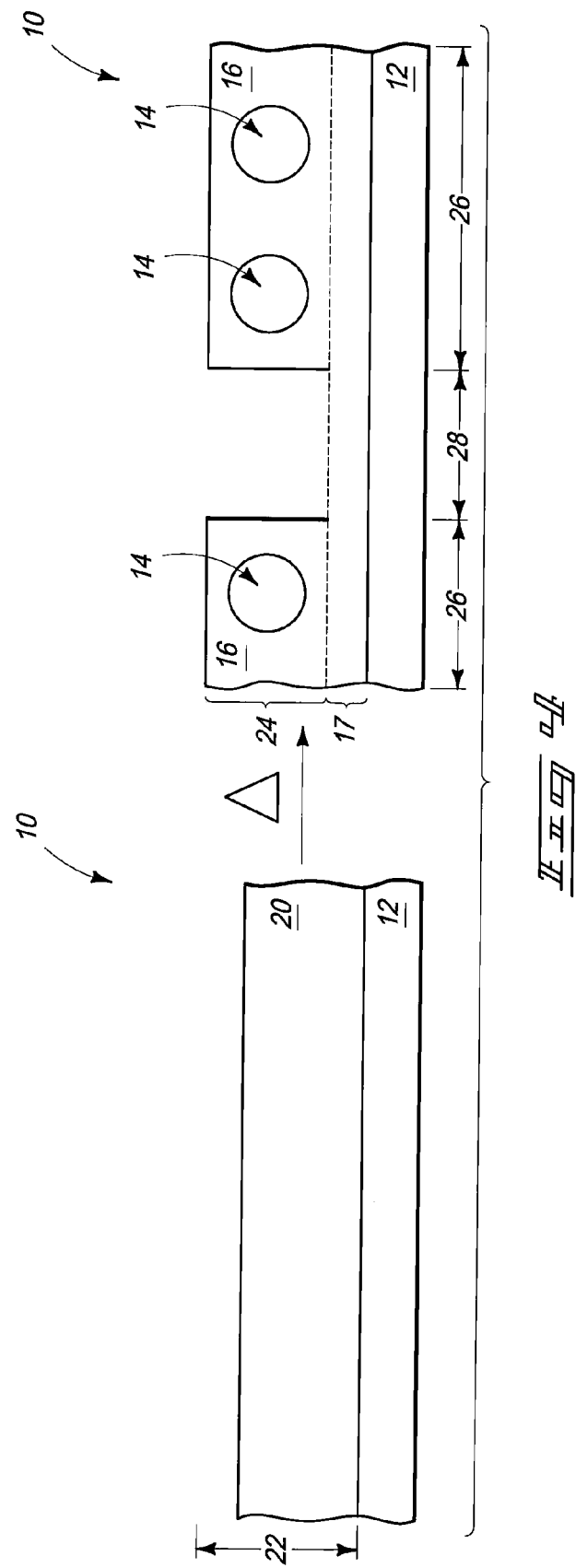
FIG. 4 diagrammatically illustrates thermal treatment of copolymer to induce self-assembly within the copolymer, and shows formation of a non-desired pattern within the copolymer.

Referring to FIG. 4, the thermal treatment of construction 10 induces self-assembly within the copolymer to form the brush layer 17, cylinders 14 and surrounding regions 16, as discussed with reference to FIG. 3. Two thermodynamically favored states which may exist after self-inducement of patterns within the copolymer are the brush layer thickness and the thickness 24 over the brush layer. Accordingly, in some applications the two thicknesses that exist in the copolymer film after self-assembly of patterns within the copolymer are the brush layer thickness and the thickness 24 over the brush layer. Since there was not enough material 20 available to form the thickness 24 across an entirety of substrate 12, the copolymer forms two different types of regions 26 and 28 during the self-assembly of patterns from the copolymer; with region 26 having the thickness 24 over the brush layer, and with region 28 having only the thickness of the brush layer. In other words, a thickness other than commensurate for an integer number of n layers of cylinders is forbidden. A film that is present at a thickness other than a commensurate thickness will bifurcate into regions of n and n−1 layers of cylinders (if the initial amount of material 20 is less than commensurate for n)—as shown in FIG. 4. Alternatively, the film may bifurcate into regions of n and n+1 layers of cylinders (if the initial amount of material 20 is more than commensurate for n)—as shown in FIG. 5.

Figure 5:
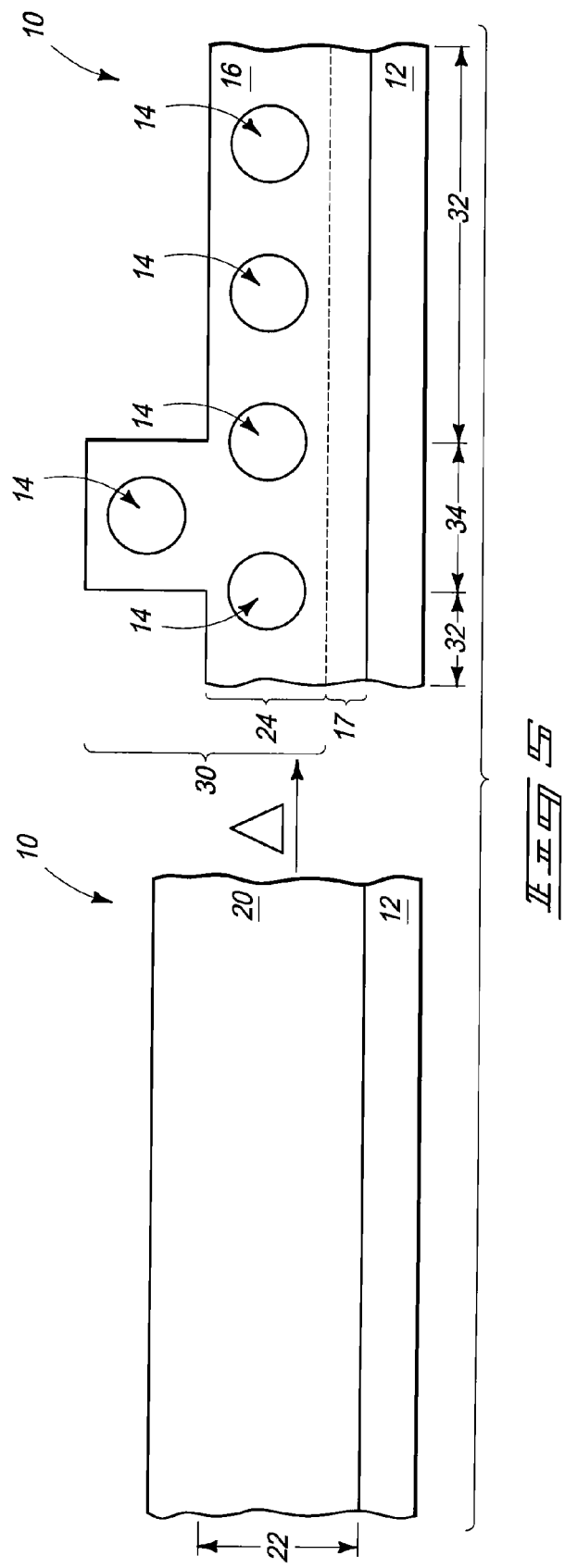
FIG. 5 diagrammatically illustrates thermal treatment of copolymer to induce self-assembly within the copolymer, and shows formation of another non-desired pattern within the copolymer.

Referring to FIG. 5, more copolymer 20 is provided than the idealized thickness 22. The thermodynamically favored states which may exist after self-inducement of patterns within the copolymer are thicknesses corresponding to n and n+1 layers of cylinders over one another. In the shown embodiment, the two thicknesses that exist in the copolymer after self-assembly of patterns within the copolymer are the thickness 24 over the brush layer; and a thickness 30 over the brush layer (with thickness 30 having two layers of cylinders). Since there was not enough material 20 available to form the thickness 30 across the brush layer over an entirety of substrate 12, the copolymer forms two different regions 32 and 34 during the self-assembly of patterns from the copolymer; with region 32 having the thickness 24 over the brush layer that is commensurate for n=1 layers of cylinders, and with region 34 having the thickness 30 over the brush layer which is commensurate with n=2 layers of cylinders.

In some applications, it is desired that a pattern formed within copolymer be uniform entirely across an underlying substrate. For instance, it may be desired to utilize a pattern formed within copolymer as a template for patterning the underlying substrate. Thus, it is desired to avoid the non-uniformities of the self-assembled patterns shown in FIGS. 4 and 5. In some applications, a monolayer of cylinders is desired.

The processing of FIGS. 3-5 illustrates self-assembly within copolymer, and shows some of the problems that can occur during such self-assembly. The difficulties discussed with reference to FIGS. 3-5 pertain to problems introduced by having too much or too little copolymer available to form a uniform thickness layer of self-assembled material across a substrate. Even if a uniform thickness layer is formed, other problems may occur in attempting to create a uniform pattern of cylinders within such layer during self-assembly of copolymer.

Figure 6:
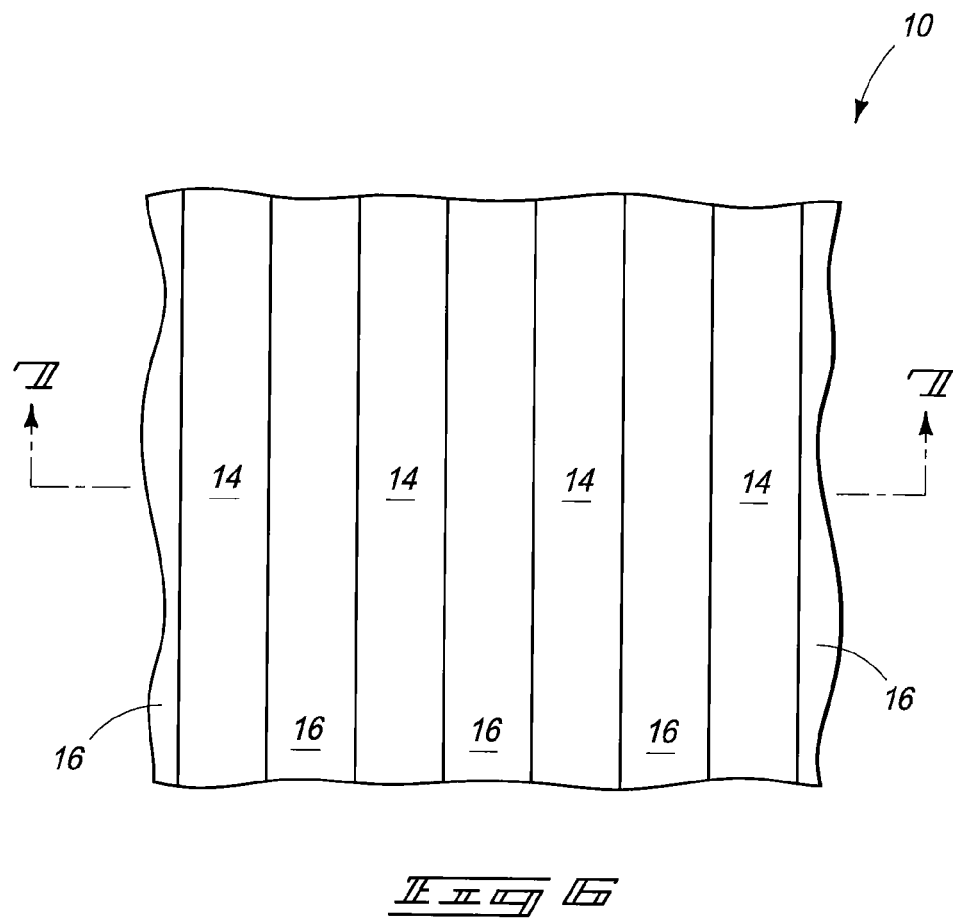
FIGS. 6 and 7 are a diagrammatic cross-sectional top view, and cross-sectional side view, respectively, of a construction comprising a pattern formed by self-assembly of a copolymer. The cross-section of FIG. 7 is along the line 7-7 of FIG. 6, and the cross-section of FIG. 6 is along the line 6-6 of FIG. 7.
Figure 7:
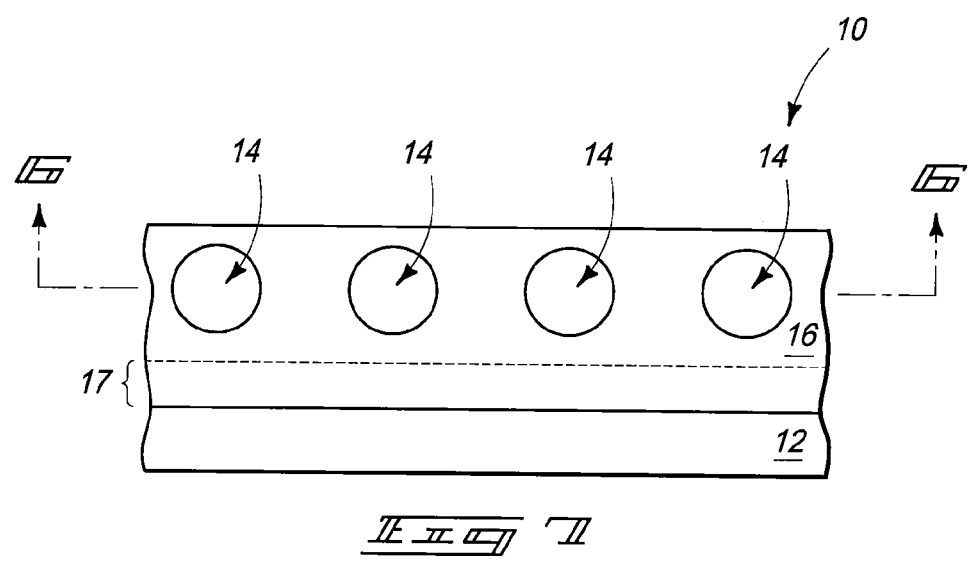

FIGS. 6 and 7 show a top view and cross-sectional side view, respectively, of a semiconductor construction 10 having an idealized pattern created during self-assembly of a pattern in copolymer. The idealized pattern is identical to that discussed above with reference to FIG. 3, and identical numbering will be used to describe FIGS. 6 and 7 as is used above to describe FIG. 3. The construction of FIGS. 6 and 7 has copolymer over a substrate 12, with such copolymer having been self-assembled into a pattern containing cylinders 14 extending through a surrounding region 16.

Figure 8:
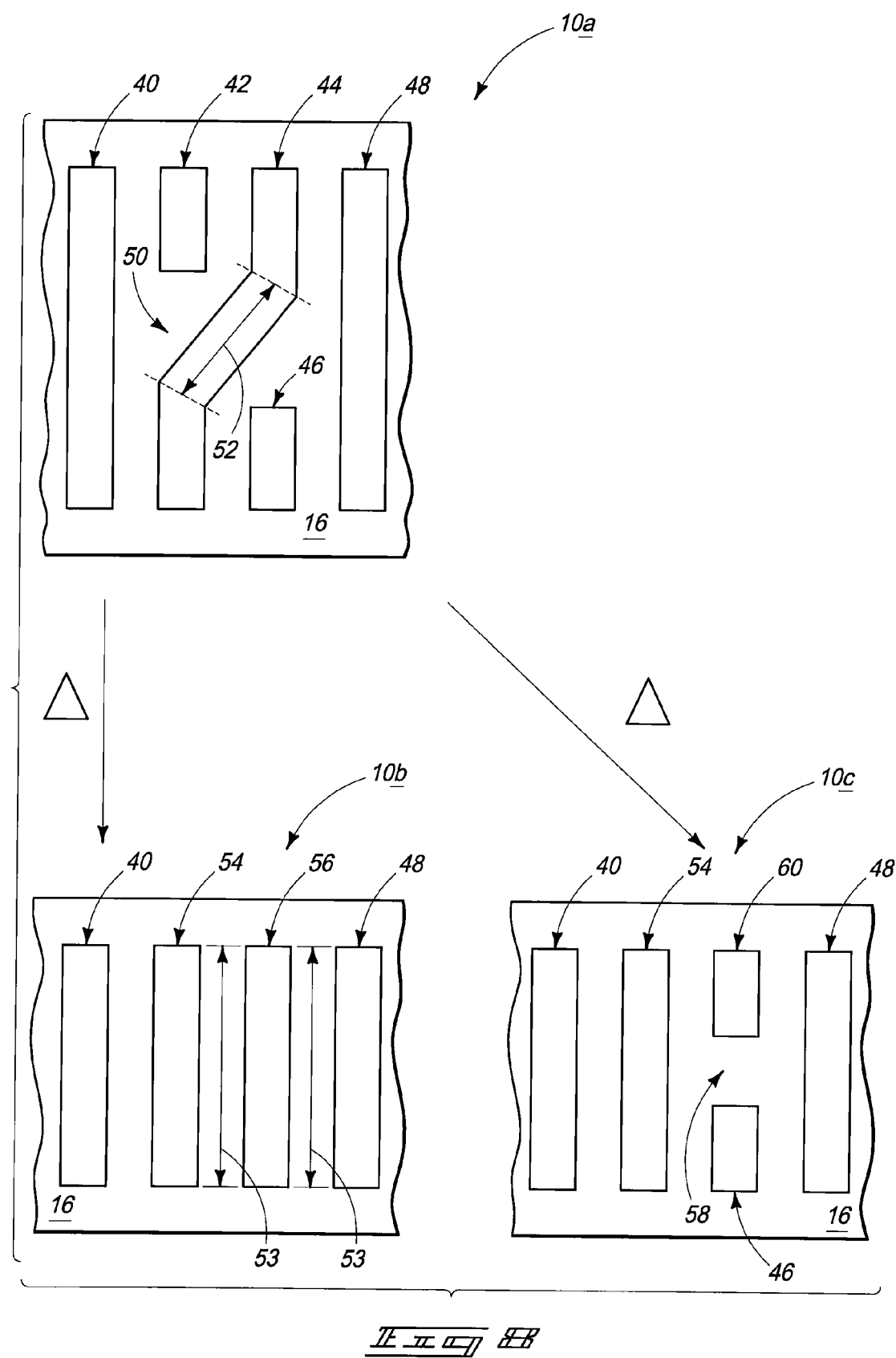
FIG. 8 is a diagrammatic cross-sectional top view of a construction comprising copolymer with a non-desired pattern therein, and illustrates two thermal treatment paths that may occur from the non-desired pattern. One thermal treatment path leads to a desired pattern within the copolymer, while another thermal treatment path leads to a non-desired pattern within the copolymer.

In the shown embodiment, the cylinders 14 are all identical to one another, extend parallel to one another, and extend parallel to an upper surface of substrate 12. The shown configuration in which the cylinders all extend parallel to one another may be thermodynamically favored relative to other configurations in which some of the cylinders are not parallel to others. However, although the favored thermodynamic configuration may correspond to a global energy minimum for the system corresponding to construction 10, there may be other localized energy wells corresponding to configurations in which one or more of the cylinders are not parallel to others. The configuration of construction 10 may be transformed between configurations corresponding to localized energy wells and the configuration corresponding to the global energy minimum by providing energy to the system. However, some of the configurations may have different lengths of cylinders than others, and thus the various configurations can only interchange with one another if there is a way to transfer cylinder-forming block material in and out of various regions of the system. For instance, FIG. 8 shows a construction 10a corresponding to a starting configuration of the construction, shows a configuration 10b that the construction 10a would ideally be interchanged with by applying energy (for instance, the thermal energy indicated by the symbol "Δ"), and shows a configuration 10c corresponding to a metastable intermediate that may be realized in the absence of sufficient material transport to fill a gap 58.

The construction 10a has a plurality of structures 40, 42, 44, 46 and 48 within a surrounding domain 16. Such structures may be cylinders analogous to the cylinders 14 discussed above with reference to FIGS. 6 and 7. However, whereas the construction of FIGS. 6 and 7 had four cylinders that extended parallel to one another, construction 10a of FIG. 8 has a pair of desired cylinders 40 and 48, and another pair of cylinders which have merged. The merging of the pair cylinders into one another has left dangling ends 42 and 46, and has left a lengthened structure 44. The structure 44 has a segment 50 which extends across a region where the cylinders have merged. The segment 50 has a length 52.

It would be desirable for construction 10a to be thermally interconvertible with the construction 10b having the desired four parallel cylinders. In other words, it would be desirable for the structures 42, 44 and 46 to rearrange to form a pair of parallel structures 54 and 56. However, structures 54 and 56 have lengths 53; and the structures 42, 44 and 46 do not have enough material between them to make two structures of length 53. Thus, thermal treatment of construction 10*a* leads to construction 10*c* having a gap 58 between a pair of structures 46 and 60. Ultimately, material must be transported to gap 58 in order to bridge structures 46 and 60 to one another and thereby form the desired structure 56 of construction 10*b*.

Figure 9:
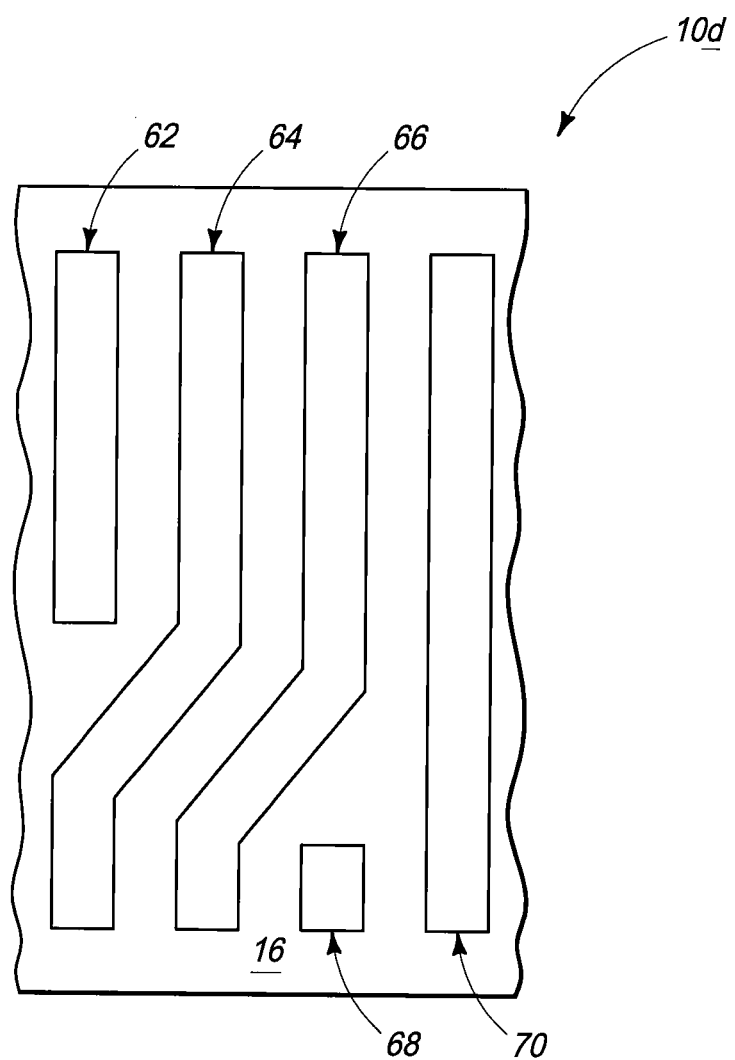
FIG. 9 is a diagrammatic cross-sectional top view of another construction comprising copolymer, and shows another non-desired pattern within the copolymer.

Construction 10*a* illustrates one of many configurations that may occur in which not all of the cylinders formed by self-assembly of copolymers are parallel to one another. Another example configuration is shown in FIG. 9 as part of a construction 10*d*. Specifically, FIG. 9 illustrates a plurality of structures 62, 64, 66, 68 and 70 formed within a domain 16 during self-assembly of copolymer. The structures 62, 64, 66, 68 and 70 are analogous to the structures 14 of FIGS. 6 and 7, but are not in the desired orientation of a plurality of identical structures extending parallel to one another.

In some embodiments, methods are proposed which may provide additional copolymer material during thermal treatment and self-assembly of copolymer so that problems analogous to those of FIGS. 4, 5, 8 and 9 may be avoided and/or fixed.

An example embodiment is described with reference to FIGS. 10-17. Similar numbering will be used to describe FIGS. 10-17 as was used to describe FIGS. 6 and 7, where appropriate.

FIGS. 10 and 11 show a construction 80 comprising a substrate 12. Substrate 12 may be a semiconductor substrate. Ultimately, copolymer is to be provided over substrate 12 and subjected to appropriate processing (for instance, thermal annealing or solvent annealing) to induce self-assembly within such copolymer.

A trench 82 is formed within substrate 12. The trench may be formed utilizing conventional processing; such as, for example, utilization of a patterned photoresist mask to define the location of the trench, etching the trench into the substrate, and then removing the mask to leave the construction shown in FIGS. 10 and 11.

A region of substrate 12 adjacent the trench has a planar upper surface 83. Such region may be considered to be a primary region of the substrate relative to the processing that is to be conducted with the copolymer. Accordingly, trench 82 may be considered to be formed in a region peripheral to such primary region. In some embodiments, a pattern formed with the copolymer over region 83 will be used as a mask for etching memory structures into region 83. The trench 82 will be in a region adjacent such memory structures, and may be formed in a material that is sacrificial relative to integrated circuitry that is ultimately to be formed to be supported by substrate 12 (for instance, the trench may be formed in a hard mask). Accordingly, trench 82 may be removed after it has been utilized in a copolymer patterning process.

Figure 12:
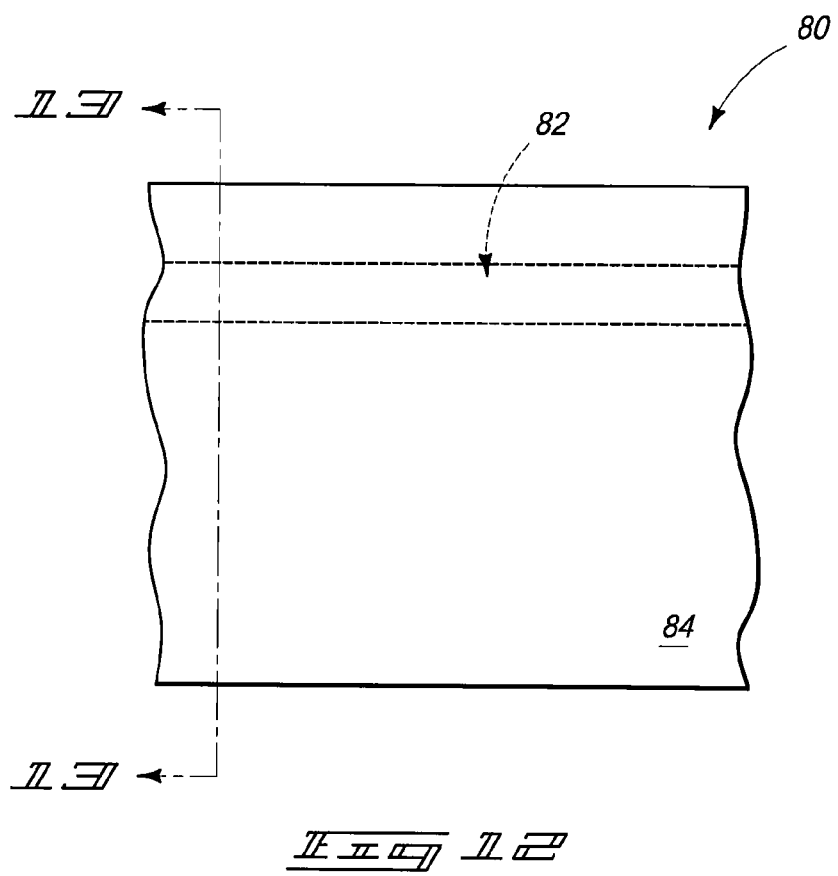
FIGS. 12 and 13 are a diagrammatic top view, and cross-sectional side view, respectively, of the construction of FIGS. 10 and 11 shown at a processing stage subsequent to that of FIGS. 10 and 11. The cross-section of FIG. 13 is along the line 13-13 of FIG. 12.
Figure 13:
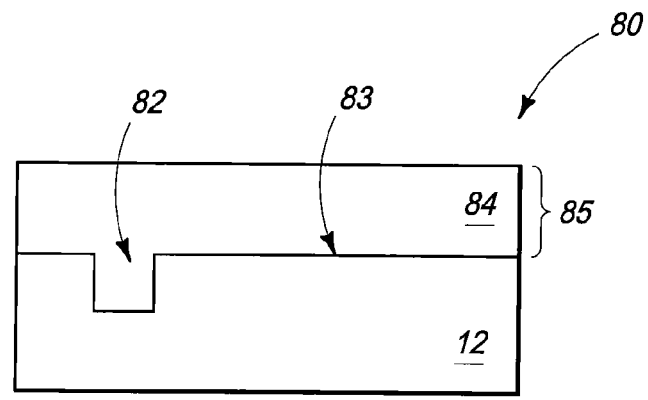

Referring to FIGS. 12 and 13, copolymer 84 is provided over substrate 12 and within trench 82. The copolymer may comprise any suitable composition, and may, for example, comprise one or more of the block and graft copolymers discussed previously. Trench 82 is under the copolymer 84 in the top view of FIG. 12, and accordingly is diagrammatically illustrated in phantom view in such figure.

The copolymer 84 is formed to a thickness 85 over primary region 83. Such thickness may be about a commensurate thickness for n layers of assembled features (for instance, the desired level 22 discussed above with reference to FIG. 3). However, as discussed below, trench 82 provides a reservoir (which may be alternatively referred to as a "well") which may stabilize the amount of copolymer over primary region 83. Excess copolymer may flow into the reservoir, or needed copolymer may flow out of the reservoir. Thus, the reservoir may be able to compensate if thickness 85 is too thin (to avoid problems of the type discussed above with reference to FIG. 4), or too thick (to compensate for problems of the type discussed above with reference to FIG. 5). In some embodiments, the copolymer 84 directly over primary region 83 may be referred to as a main body of the copolymer film, and the copolymer within trench 82 may be referred to as a volume of copolymer that is in fluid communication with the main body.

Figure 14:
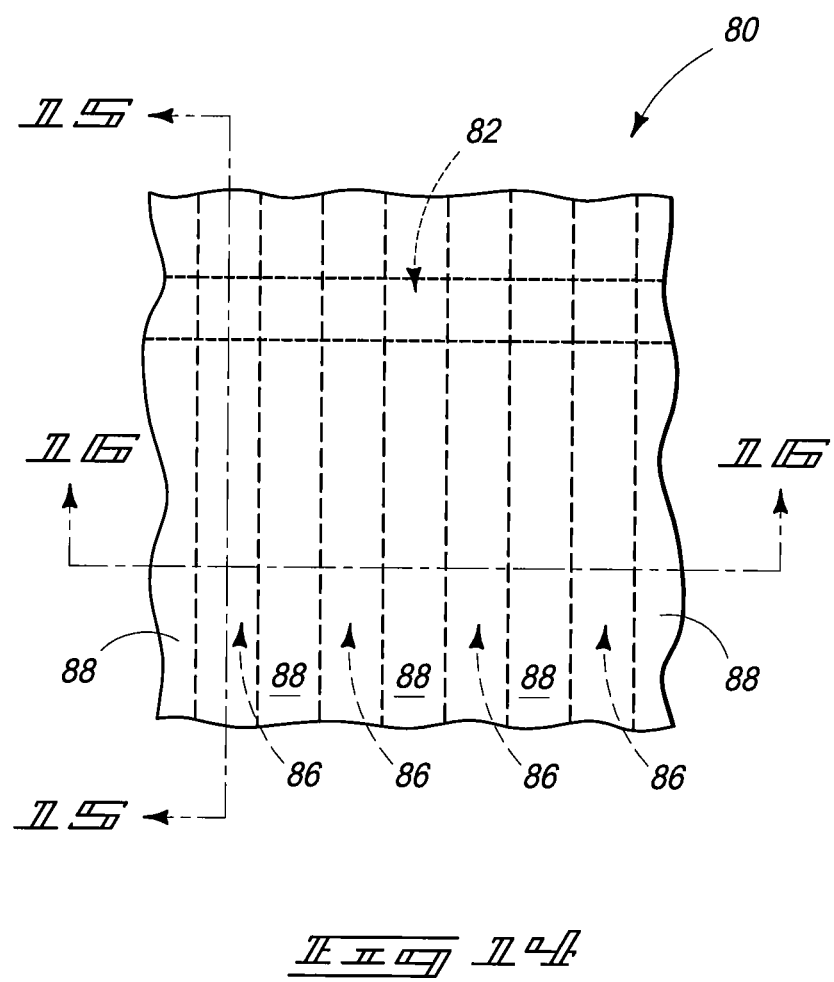
FIGS. 14-16 are a diagrammatic top view, and a pair of cross-sectional side views, of the construction of FIGS. 10 and 11 shown at a processing stage subsequent to that of FIGS. 12 and 13. The cross-section of FIG. 15 is along the lines 15-15 of FIGS. 14 and 16; and the cross-section of FIG. 16 is along the lines 16-16 of FIGS. 14 and 15.
Figure 15:
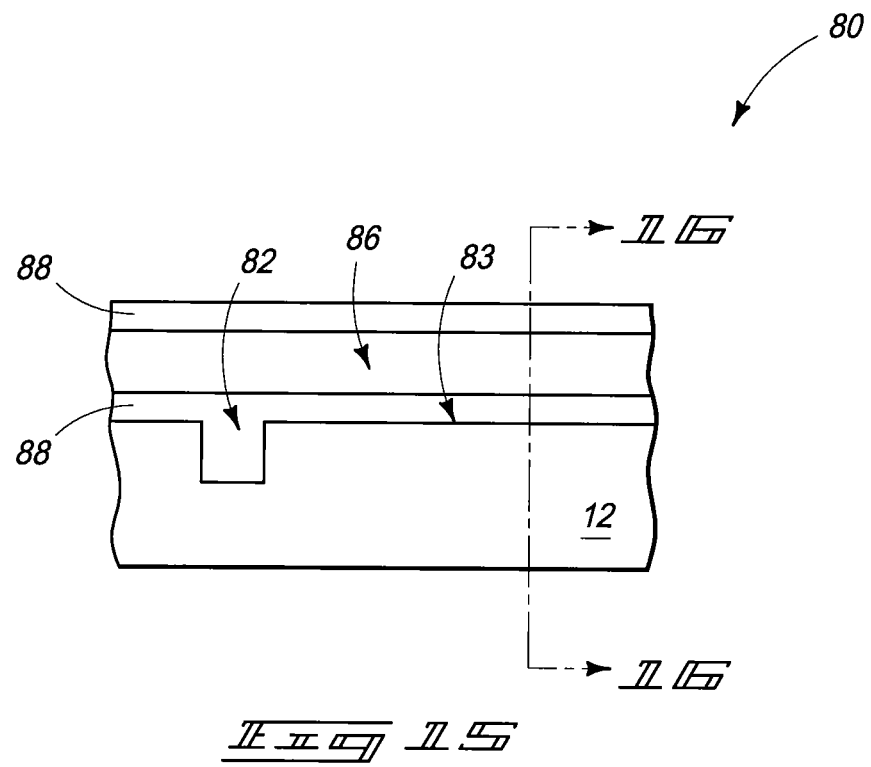
Figure 16:
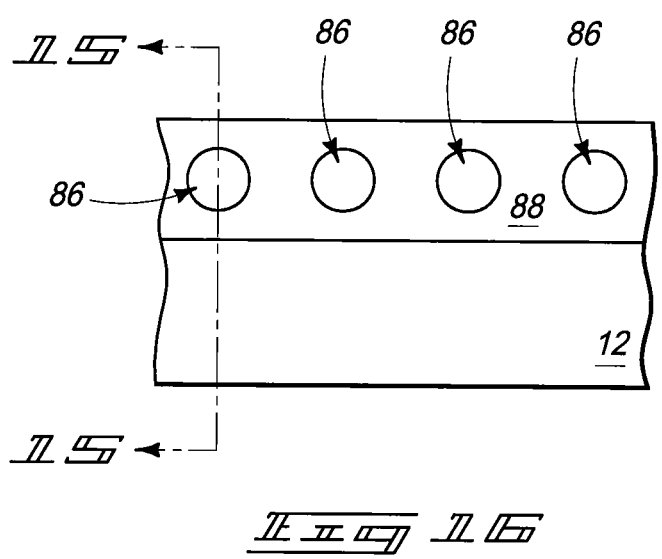

Referring to FIGS. 14-16, copolymer 84 (FIGS. 12 and 13) is subjected to processing to cause self-assembly within such copolymer. Accordingly, the copolymer transforms into structures 86 and surrounding domain 88. In the shown embodiment, the cylinders extend parallel to the upper surface of substrate 12, and extend over the trench 82. Copolymer may travel between the cylinders and the reservoir of copolymer within trench 82 during thermal processing. The copolymer traveling to and from the reservoir may compensate for problems of the types described above with reference to FIGS. 4 and 5, and/or may provide the additional material that enables non-parallel cylinders to be converted to parallel cylinders (for instance, which enables a construction of the type shown in FIG. 8 as 10*a* to be converted to the construction 10*b* of FIG. 8).

Although a single reservoir is utilized in the processing of FIGS. 10-16, in other embodiments there may be more than one reservoir utilized. For instance, the shown trench 82 may be formed on one side of a primary region 83 of the substrate, and another trench may be formed on an opposing side of the primary region. There may be advantages to using reservoirs on both sides of the primary region (i.e., paired reservoirs), rather than using a single reservoir, in that material will not need to flow as far from individual reservoirs if pairs of reservoirs are utilized. The width and depth of the reservoir (or reservoirs in some embodiments) may be adjusted to regulate the volume of copolymer within the reservoir.

Figure 17:
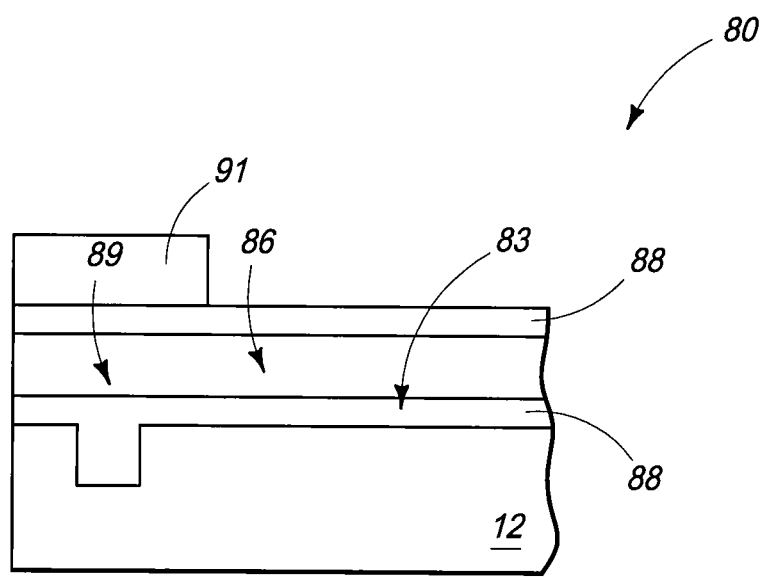
FIG. 17 is a diagrammatic cross-sectional side view of the construction of FIGS. 10 and 11 shown at a processing stage of subsequent to that of FIGS. 14-16.

FIG. 17 shows construction 80 at a processing stage subsequent to that of FIGS. 14-16, and specifically shows that a masking material 91 (for instance, photoresist) is patterned to protect region 89 of construction 80 while leaving the region over primary surface 83 exposed. In subsequent processing (not shown), structures 86 may be used as patterned features during an etch into the underlying substrate 12 of primary region 83. Such etch may form a repeating pattern of lines within substrate 12, and such lines may be incorporated into integrated circuit structures and/or utilized for subsequent patterning of integrated circuit structures.

Figure 18:
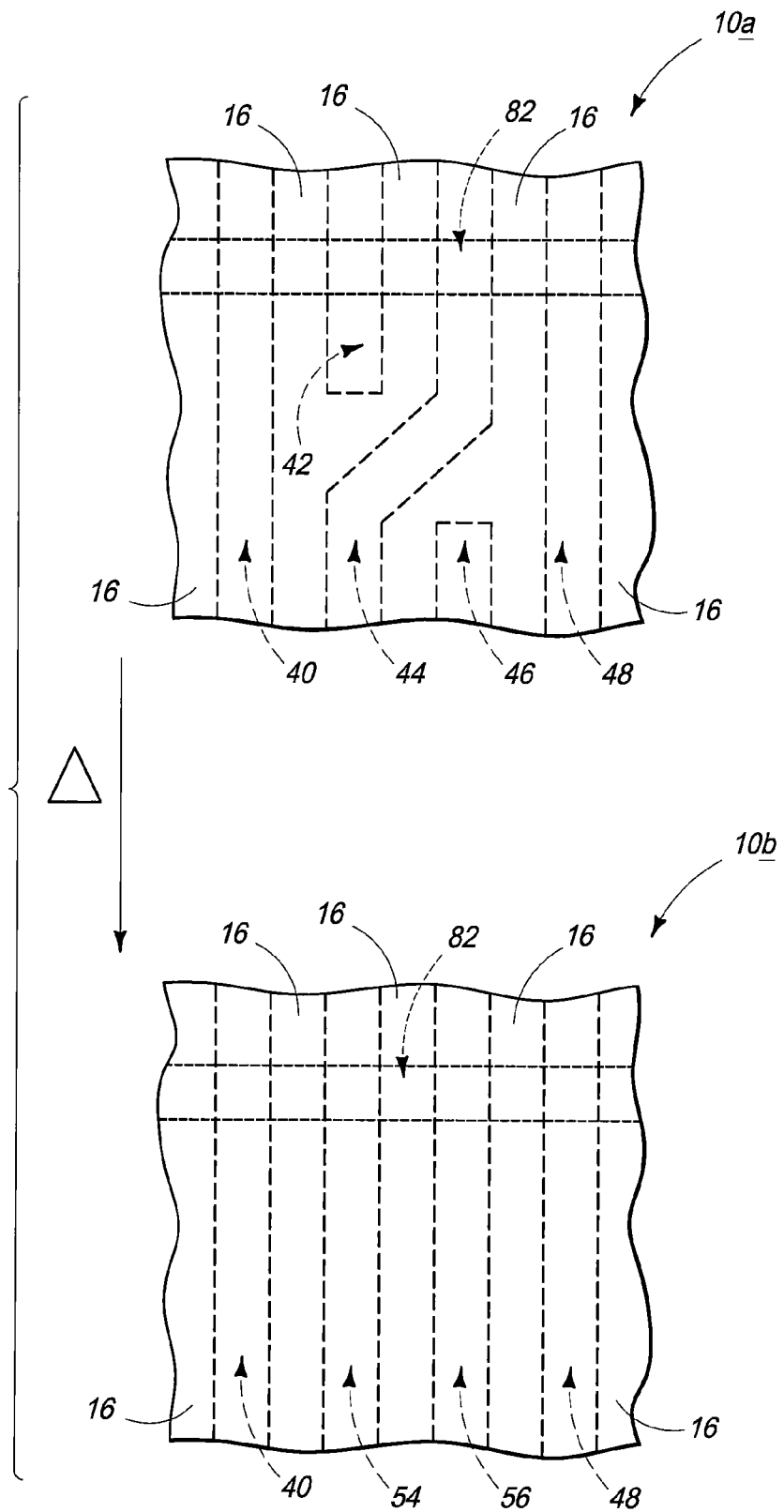
FIG. 18 is a diagrammatic top view of a construction comprising copolymer with a non-desired pattern therein, and illustrates a thermal treatment path that leads to a desired pattern within the copolymer.

FIG. 18 shows a top view of a construction 10*a* analogous to the construction 10*a* of FIG. 8, but comprising a trench 82 of the type described above with reference to FIGS. 10-16. The construction 10*a* of FIG. 18 has structures 40, 42, 44, 46 and 48 extending within a surrounding domain 16; with such structures and surrounding domain being formed from self-assembled copolymer. Construction 10*a* is shown in top view in FIG. 18, rather than along the cross-section of FIG. 8, and accordingly structures 40, 42, 44, 46 and 48, as well as trench 82, are beneath the surface of surrounding domain 16; and thus shown in phantom view.

FIG. 18 shows that thermal treatment of construction 10*a* may convert structures 42, 44 and 46 into the desired structures 54 and 56, and thereby form construction 10*b*. Specifically, copolymer within trench 82 provides the additional material which enables formation of construction of 10*b*, rather than the construction 10*c* of FIG. 8. The copolymer in the reservoir may flow into and out of an array of cylinders in order to provide a monolayer of cylinders everywhere within a "primary region". The change in film thickness directly over the trench may lead to n±1 cylinders directly over the trench, but this area may be later removed.

It is noted that copolymer remains amenable to assembly-inducing treatment (for instance, thermal treatment, or treatment appropriate for a solvent anneal) even after the copolymer has self-assembled. Accordingly, in some embodiments the copolymer may be thermally treated to induce self-assembly, and then cooled to lock the self-assembled structures into a particular configuration; subsequently, the copolymer may be again thermally treated, and the self-assembled structures may redistribute into another configuration. Thus, if a copolymer initially self-assembles into an undesired configuration, the copolymer may be induced to assemble into a desired configuration through additional assembly-inducing treatments of the copolymer. In some embodiments, self-assembly of copolymer may utilize multiple sequential assembly-inducing treatments (such as, for example, multiple sequential thermal treatments, or local "zone" annealing treatments).

The utilization of a reservoir of copolymer is one method for mitigating the occurrence of defects analogous to those of FIGS. 4, 5, 8 and 9. Another method is to provide a retaining wall around a main body of copolymer to prevent flow of copolymer away from the main body during induction of self-assembly within the copolymer. An example method of utilizing a retaining wall is described with reference to FIGS. 19-24. Similar numbering will be used to describe FIGS. 19-24 as was used to describe FIGS. 6 and 7, where appropriate.

Figure 19:
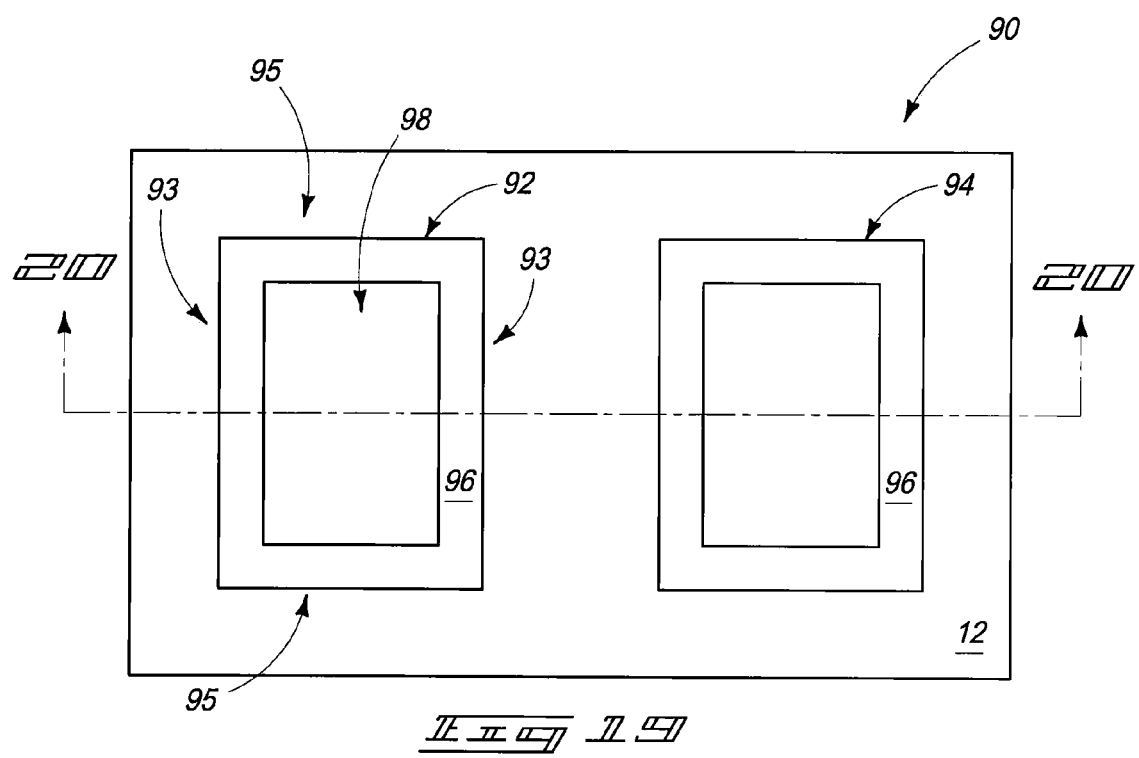
FIGS. 19 and 20 are a diagrammatic top view, and cross-sectional side view, respectively, of a construction at a processing stage of an example embodiment method. The cross-section of FIG. 20 is along the line 20-20 of FIG. 19.
Figure 20:
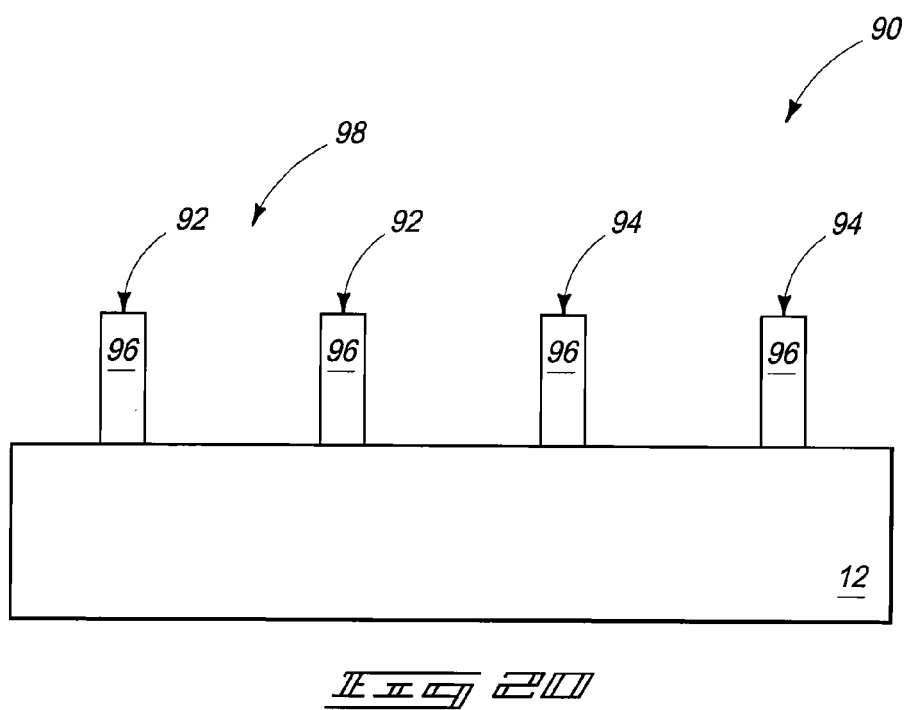

Referring to FIGS. 19 and 20, a construction 90 is shown to comprise substrate 12, and a pair of retaining walls 92 and 94 formed over the substrate. The retaining walls comprise a material 96. Material 96 may comprise any suitable composition or combination of compositions, and in some embodiments may comprise, consist essentially, or consist of a silicon-containing material; such as, for example, polysilicon, silicon dioxide, etc.

Retaining walls 92 and 94 may be formed by any suitable methodology. In some embodiments, the retaining walls may be formed by providing a layer of material 96 across substrate 12, forming a patterned photoresist mask over such layer, etching the layer to transfer a pattern from the mask into the layer, and then removing the mask to leave the construction of FIGS. 19 and 20.

The shown retaining walls have annular shapes (i.e., encircle regions of the underlying substrate). The annular shapes of retaining walls 92 and 94 are polygonal in the shown embodiment, but may be any suitable shape. In the specific embodiment of FIGS. 19 and 20, the annular shapes are rectangular. The retaining wall 92 defines a walled-in region 98 therein; has a pair of long sides 93 on opposing sides of the walled-in region, and has a pair of narrow sides 95 on other opposing sides of the walled-in region. Retaining wall 94 defines a similar walled-in region.

Figure 21:
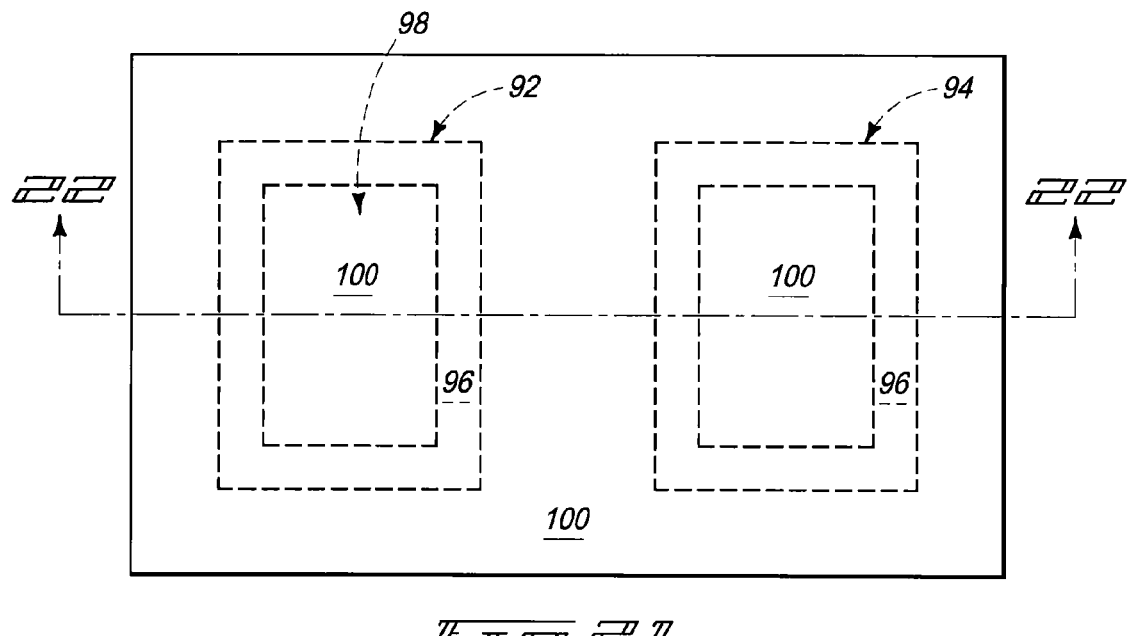
FIGS. 21 and 22 are a diagrammatic top view, and cross-sectional side view, respectively, of the construction of FIGS. 19 and 20 shown at a processing stage subsequent to that of FIGS. 19 and 20. The cross-section of FIG. 22 is along the line 22-22 of FIG. 21.
Figure 22:
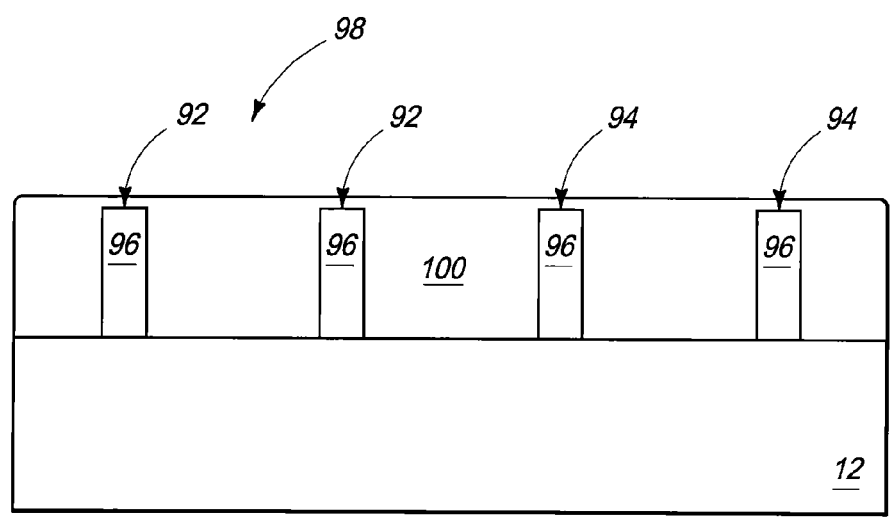

Referring next to FIGS. 21 and 22, copolymer 100 is formed within the walled-in regions (for instance, region 98) defined by walls 92 and 94, and also is formed across regions of substrate 12 exterior of such walled-in regions. In the shown embodiment, the copolymer 100 fills the walled-in regions defined by retaining walls 92 and 94, and is held to a desired commensurate thickness within such walled in regions by the retaining walls. In contrast, the copolymer that is exterior of the walled-in regions is not held to the desired commensurate thickness, and instead is free to disperse across the underlying substrate to create regions of varying thicknesses. The copolymer wets along the walls 92 and 94, and thus forms meniscuses along the exteriors of the walls.

Referring to FIGS. 23 and 24, the copolymer is treated to induce self-assembly within the copolymer, and to thus form structures 102, 104, 106 and 108 within the walled-in regions defined by the annular walls 92 and 94. The assembly-inducing treatment may comprise any suitable treatment, including, for example, a thermal anneal and/or a solvent anneal. The structures 102, 104, 106 and 108, walls 92 and 94, and other components of the construction shown in FIGS. 23 and 24 are diagrammatically illustrated, and are not drawn to scale.

The structures 102, 104, 106 and 108 are themselves annular, and correspond to a first domain created by the treatment of the copolymer. The structures 102, 104, 106 and 108 are surrounded by a second domain 110 that is also created by the treatment of the copolymer. The structures 102, 104, 106 and 108 may be considered to be analogous to the cylinders 14 of FIGS. 6 and 7, and the surrounding domain 110 may be considered to be analogous to the domain 16 of FIGS. 6 and 7. The structures 102, 104, 106 and 108 have cylindrical cross-sections, as shown in the cross-sectional view of FIG. 24.

The retaining walls are formed of a composition that is wettable by a same subunit of the copolymer that wets substrate 12 (for instance, the subunit "A" of the diblock copolymer "A-B" of FIG. 1). Thus, the walls, together with substrate 12, define an orientation of the structures formed from the copolymer during self-assembly of the copolymer.

The retaining walls 92 and 94 keep the copolymer at a uniform thickness within the walled-in regions during self-assembly of the copolymer, as shown in FIGS. 21-24. Thus, the structures 102, 104, 106 and 108 formed within such walled-in regions during self-assembly of the copolymer are uniform in size, parallel to one another, and parallel to an upper surface of substrate 12. In contrast, in the shown embodiment the copolymer exterior of the annular walls is not maintained at a constant thickness, and instead may flow across the substrate to create regions of differing thickness, due to, for example, hole formation or dewetting.

Structures 112 are shown to form exterior to annular walls 92 and 94 in the regions of copolymer that are not a constant thickness. The structures 112 correspond to cylinders extending normal to an upper surface of substrate 12, and parallel to exterior surfaces of retaining walls 92 and 94. Structures 112 are examples of structures that may be formed additionally to, or alternatively to, cylinders that extend parallel to an upper surface of substrate 12. Structures 112 may form in some locations where copolymer is thin. Although FIGS. 23 and 24 show structures 112 uniformly formed across along the external periphery of walls 92 and 94, in other embodiments the structures 112 may not form uniformly; and thus may be in some locations external of walls 92 and 94, but not in other locations external of the walls.

In subsequent processing, the narrow ends of the annular walls 92 and 94 (for instance, ends 95 of the annular wall 92, [FIG. 19]), together with ends of the annular structures 102, 104, 106, and 108, may be protected with a patterned masking material (analogous to the material 91 of FIG. 17) to leave segments of structures 102, 104, 106 and 108 exposed as a plurality of parallel structures. Such exposed parallel structures may then be used as mask during one or more etches into the underlying substrate 12.

FIGS. 23 and 24 show that self-assembly of copolymer may form cylinders that are perpendicular to an upper surface of substrate 12 (specifically, the structures 112), under some conditions. In some embodiments, such cylinders may be desired. For instance, it may be desired to form a pattern suitable for creating tightly-spaced repeating structures of cross-point memory. In such applications, conditions may be chosen to form a plurality of cylinders normal to the surface of substrate 12, rather than a plurality of cylinders parallel to the surface of substrate 12. Also, some conditions may lead to formation of spherical structures over substrate 12, rather than the illustrated cylindrical structures (for instance, conditions having a volume ratio of domains A and B of about 20:80, or reverse, may lead to formation of spherical structures). The spherical structures, like structures 112, may be advantageous in applications in which is desired to form a plurality of tightly packed masking structures.

In some embodiments, reservoirs of the type described with reference to FIGS. 10-16 may be utilized in combination with retaining walls during patterning of copolymer. An example of such combination is described with reference to FIGS. 25-28.

Figure 25:
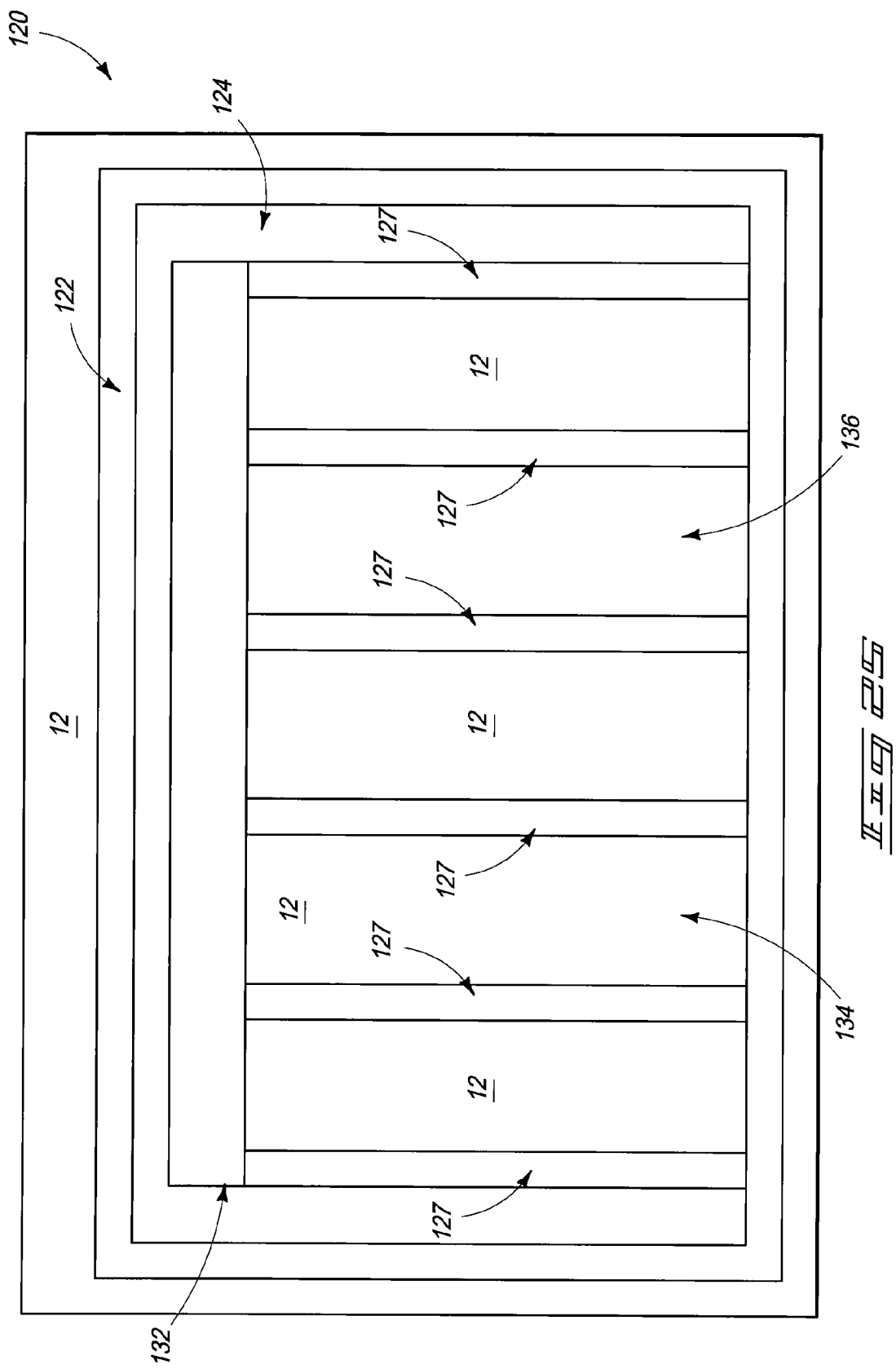
FIGS. 25 and 26 are diagrammatic top views of a construction at a processing stage of an example embodiment method. The processing stage of FIG. 26 is subsequent to that of FIG. 25.

Referring to FIG. 25, a construction 120 is shown to comprise a substrate 12 having a first retaining wall 122 thereover. The first retaining wall 122 is annular shaped, and defines a walled-in region 124 therein.

A trench 132 is formed to extend into substrate 12. The trench 132 is within the walled-in region 124.

A plurality of additional retaining walls 127 are provided over substrate 12 and within the walled-in region 124. Such additional retaining walls are shaped as weirs extending perpendicular to a length of trench 132.

The substrate 12 may have a planar upper surface. The trench 132 only consumes a portion of walled-in region 124, and leaves regions of the upper surface of substrate 12 extending between the walls 127.

Figure 26:
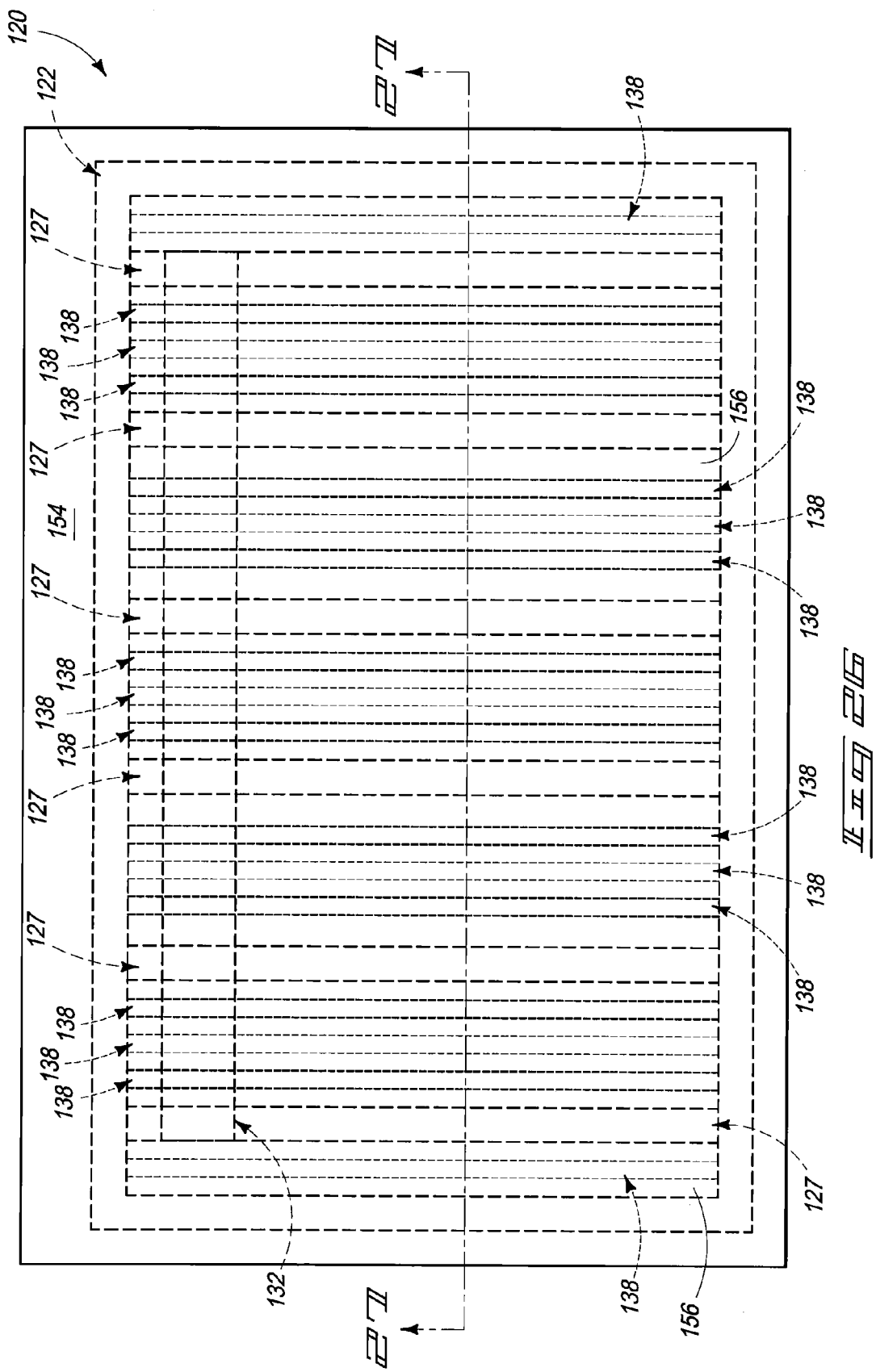
Figure 27:
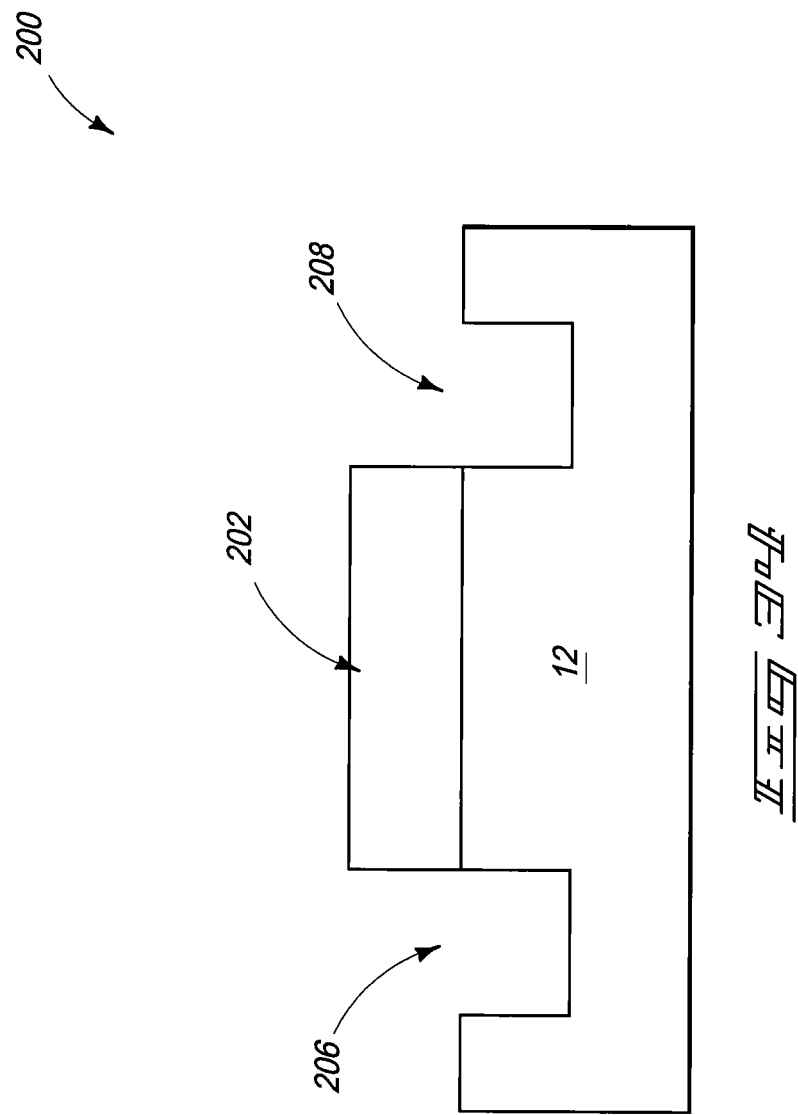
FIG. 27 is a diagrammatic, cross-sectional view along the line 27-27 of FIG. 26.

Referring to FIGS. 26 and 27, copolymer is provided across substrate 12, and then self-assembly of the copolymer is induced to convert the copolymer into two different domains. One of said domains is a plurality of structures 138, and the other of said domains is a substance 156 surrounding such structures. The structures 138 align parallel to the weirs 127; and accordingly the weirs may be used for aligning the structures 138 in a desired orientation. The weirs may be on pitch with structures 138 in some embodiments, and may be off pitch relative to a pitch of the cylinders in other embodiments. In the shown embodiment, the retaining walls 127 have a different composition than retaining wall 122. Specifically, the composition of retaining walls 127 is selectively wet by one of the subunits of the copolymer relative to another subunit so that the retaining walls 127 orient the structures 138. In contrast, retaining wall 122 is of a composition that is neutral relative to wetting by the various subunits of the copolymer, and thus does not orient the structures 138. Thus, the ends of the structures 138 terminate at the wall 122. In other embodiments, retaining wall 122 may be of a composition that orients structures 138, and in such embodiments the structures 138 may be annular analogously to the structures 102, 104, 106 and 108 of FIG. 23.

Referring to FIG. 28, regions of construction 120 may be protected with a protective masking material 157 to form protected sections 158 and 160. Material 157 may comprise photoresist, for example. Segments of structures 138 between the protected regions form a plurality of parallel lines. In subsequent processing (not shown) such parallel lines may be utilized as a mask over the underlying substrate to create a pattern of spaced parallel features within such substrate. The spaced parallel features may be incorporated into integrated circuitry. For instance, there are numerous applications in integrated circuit memory fabrication (for instance, DRAM fabrication, NAND fabrication, cross-point memory fabrication, etc.) in which it is desired to form a plurality of closely-spaced parallel lines.

Figure 29:
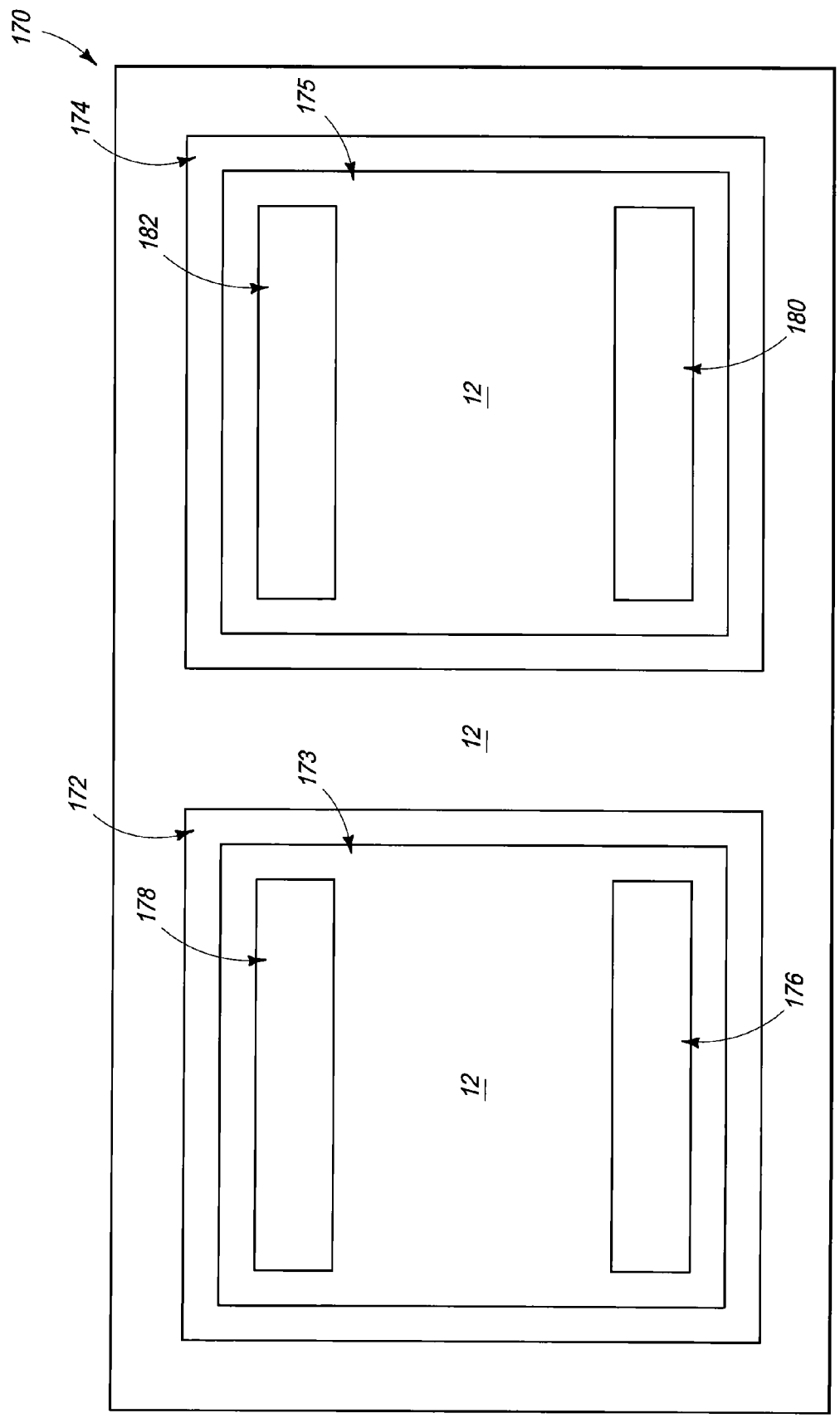
FIGS. 29-31 are diagrammatic top views of a construction at a various sequential processing stages of an example embodiment method.
Figure 30:
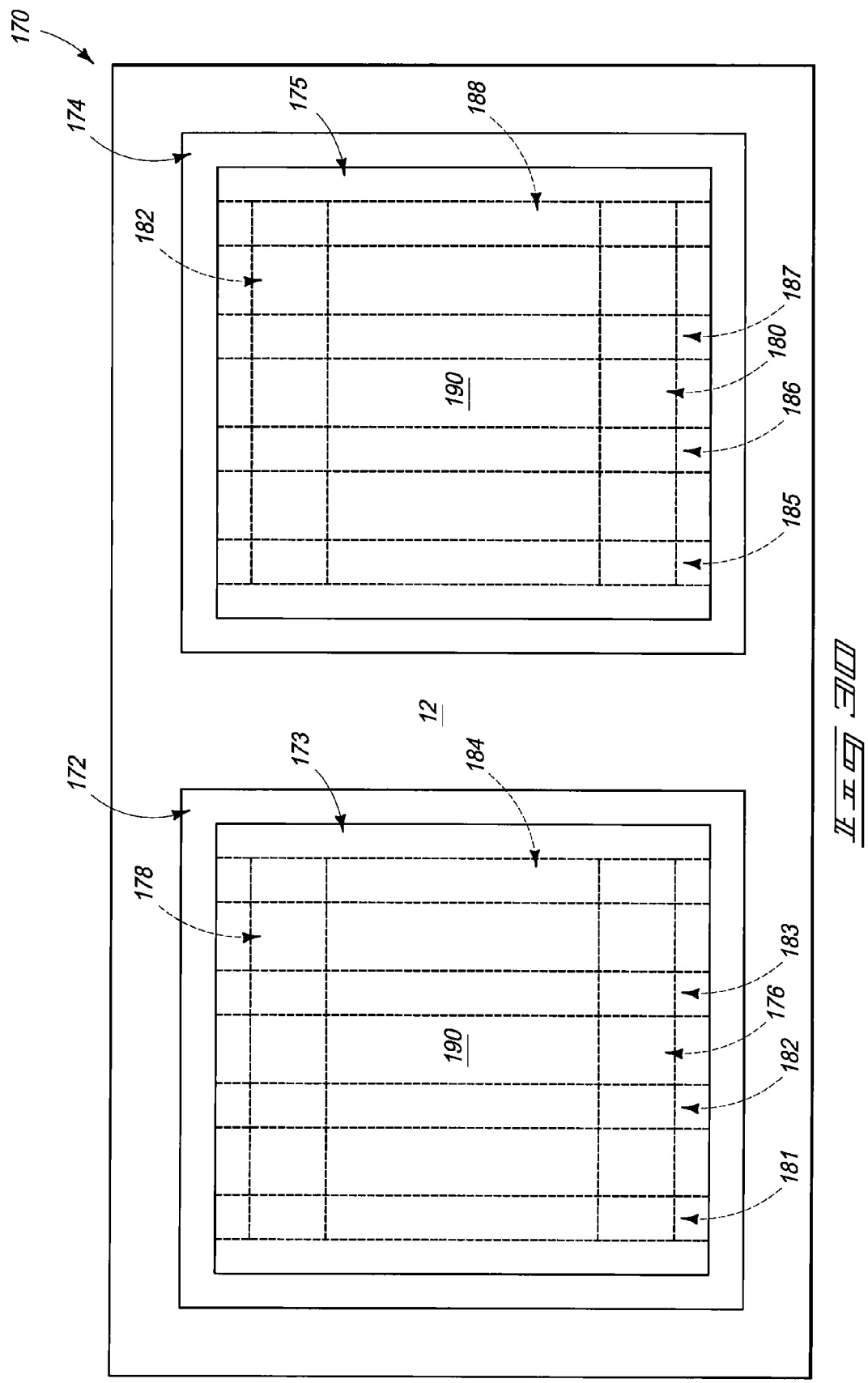
Figure 31:
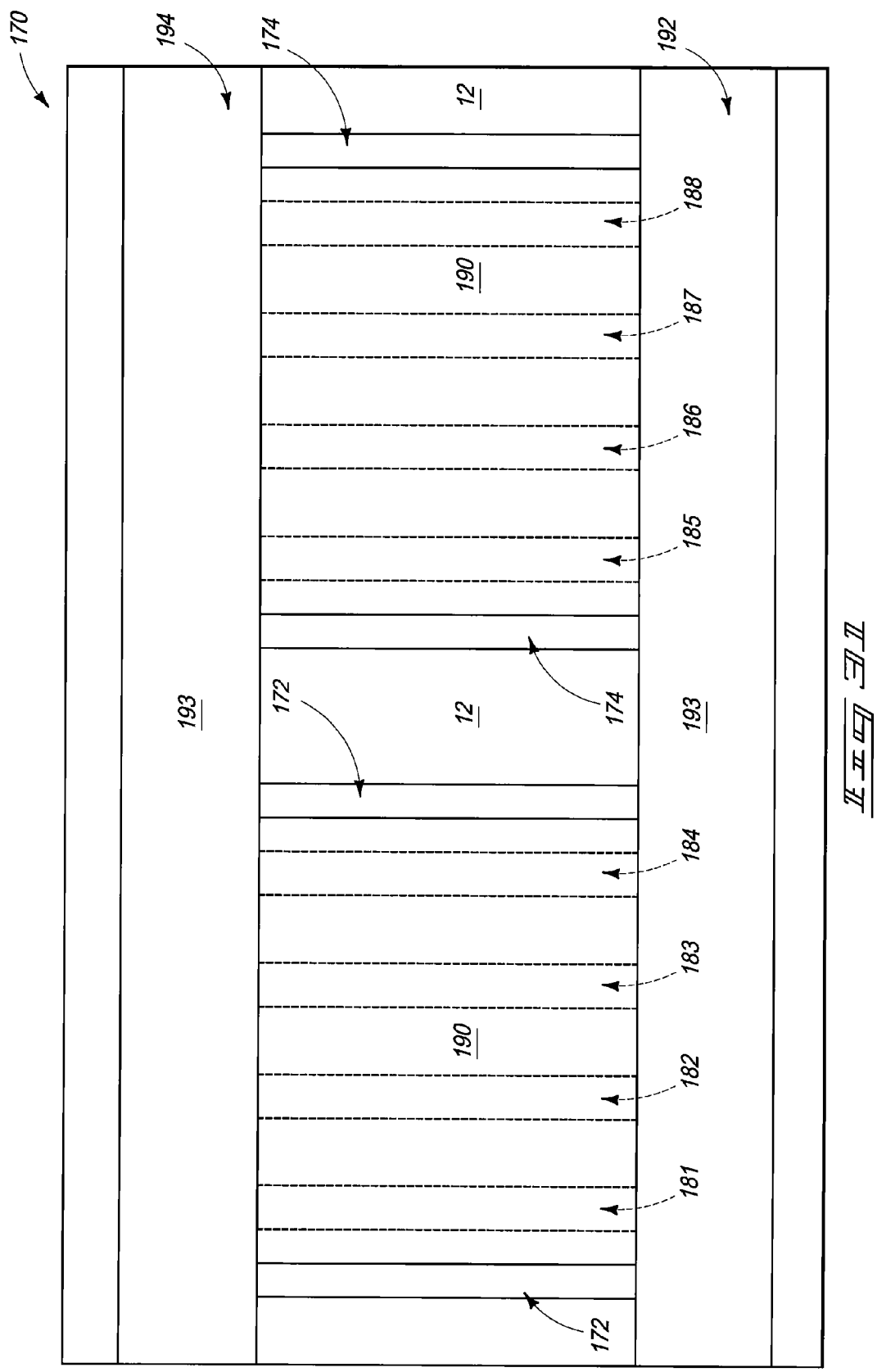
Figure 22:
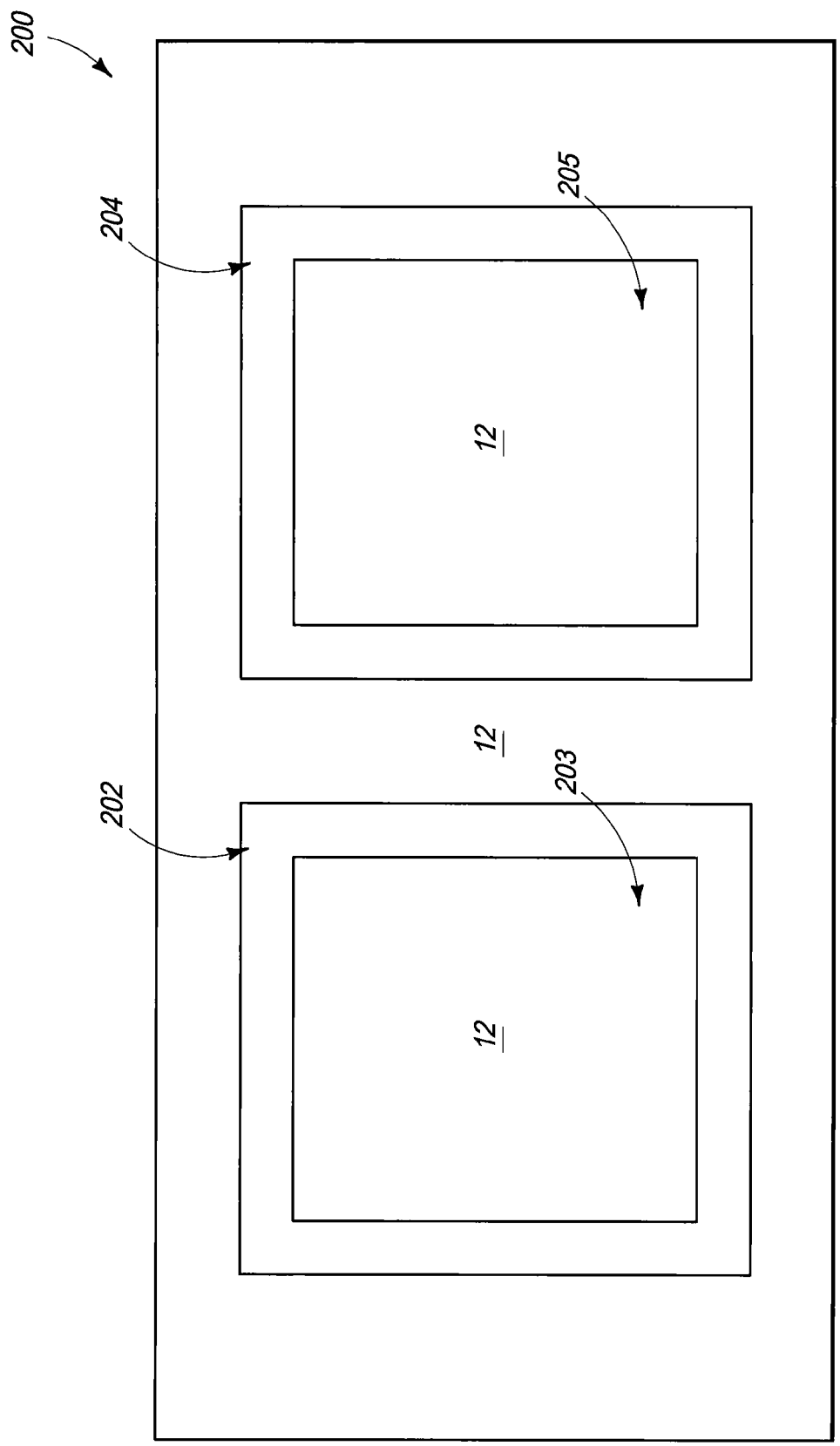

FIGS. 29-31 illustrate another example embodiment in which reservoirs of the type described with reference to FIGS. 10-16 may be utilized in combination with retaining walls of the type described with reference to FIGS. 18-24 during patterning of copolymer.

Referring to FIG. 29, a construction 170 comprises a substrate 12 having a pair of retaining walls 172 and 174 thereover. The retaining walls are annular, and define walled-in regions 173 and 175 therein.

Trenches 176, 178, 180 and 182 are formed to extend into substrate 12. The trenches are in pairs, with one pair being in walled-in region 173 (specifically, trenches 176 and 178), and another pair being in walled-in region 175 (specifically, trenches 180 and 182).

Referring to FIG. 30, copolymer is provided across substrate 12, and then self-assembly of the copolymer is induced to convert the copolymer into two different domains. One of said domains is a plurality of structures 181-188, and the other of said domains is a substance 190 surrounding such structures. The structures 181-188 may be cylinders formed to extend parallel to a surface of substrate 12, and between paired reservoirs that are on opposing sides of such cylinders. Although the copolymer is shown only within the walled-in regions 173 and 175, the copolymer may also be exterior to the walled-in regions. In some embodiments, the structures 181-188 may not be on pitch. Also, in some embodiments the widths of structures 181-188 may be longer or shorter than the gaps between the structures (as shown), while in other embodiments the gaps between the structures may be of a same dimension as the widths of the structures.

Referring to FIG. 31, regions 192 and 194 of construction 170 may be protected with a protective masking material 193. The material 193 may be patterned photoresist, for example. Segments of structures 181-188 between the regions 192 and 194 form a plurality of parallel lines. In subsequent processing (not shown) such parallel lines may be utilized as a mask over the underlying substrate to create a pattern of spaced parallel features within such substrate.

FIGS. 32-37 illustrate yet another example embodiment in which reservoirs of the type described with reference to FIGS. 10-16 may be utilized in combination with retaining walls of the type described with reference to FIGS. 18-24 during patterning of copolymer.

Referring to FIG. 32, a construction 200 comprises a substrate 12 having a pair of retaining walls 202 and 204 thereover. The retaining walls are annular, and define walled-in regions 203 and 205 therein.

Referring to FIGS. 33 and 34, a region of construction 200 may be protected with a protective mask (not shown) while opposing sections of the walled-in regions 202 and 204 (FIG. 32) are removed, together with some of the underlying substrate, to form trenches 206 and 208; and then the protective mask may be removed to leave the shown construction. The trenches 206 and 208 and may be utilized as reservoirs during subsequent assembly-inducing treatment of copolymer.

Figure 35:
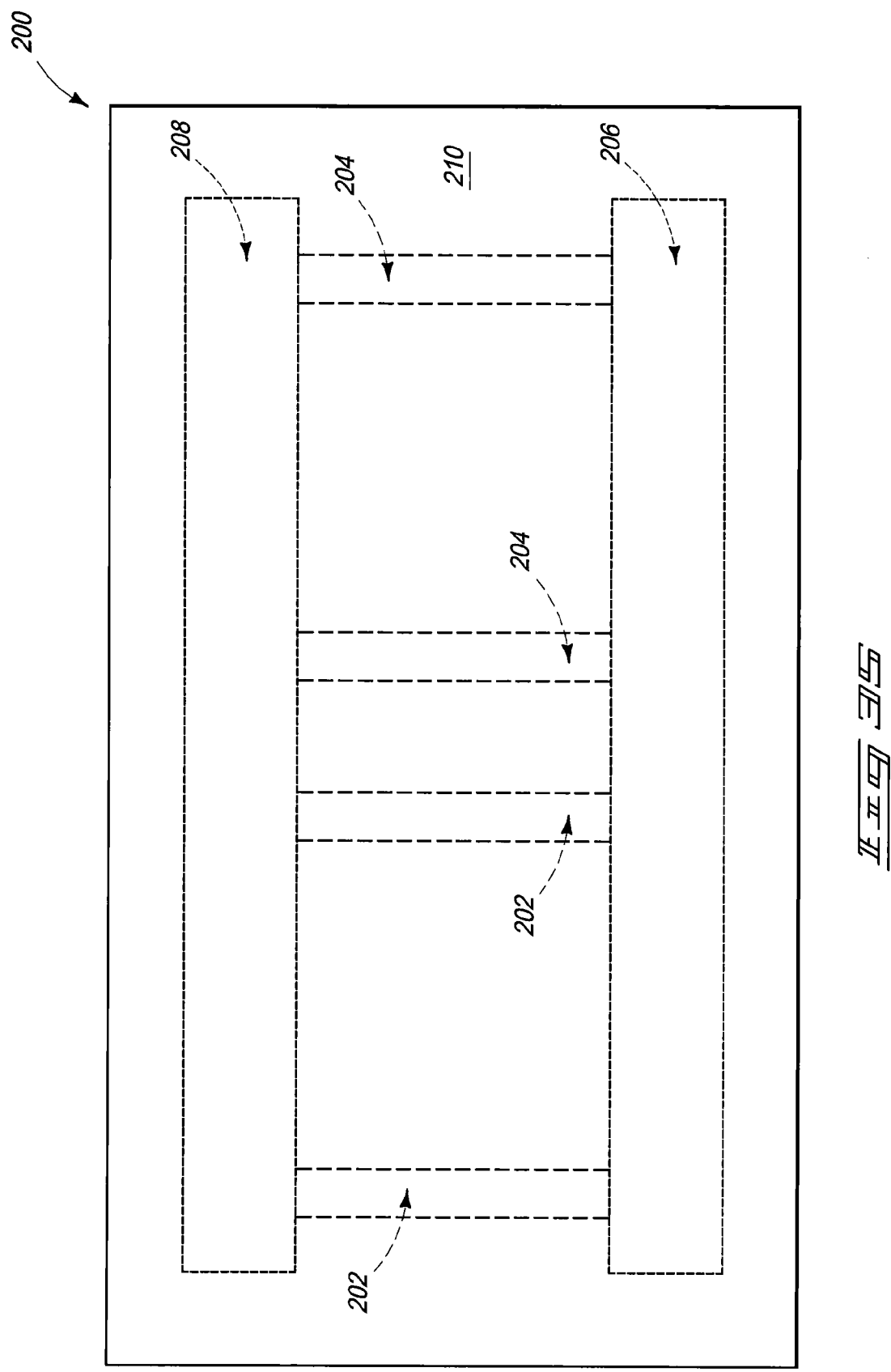
FIG. 35 is a diagrammatic top view of the construction of FIG. 32 shown at a processing stage subsequent to that of FIG. 33.

Referring to FIG. 35, copolymer 210 is provided over substrate 12 (FIG. 34) and within reservoirs 206 and 208.

Figure 36:
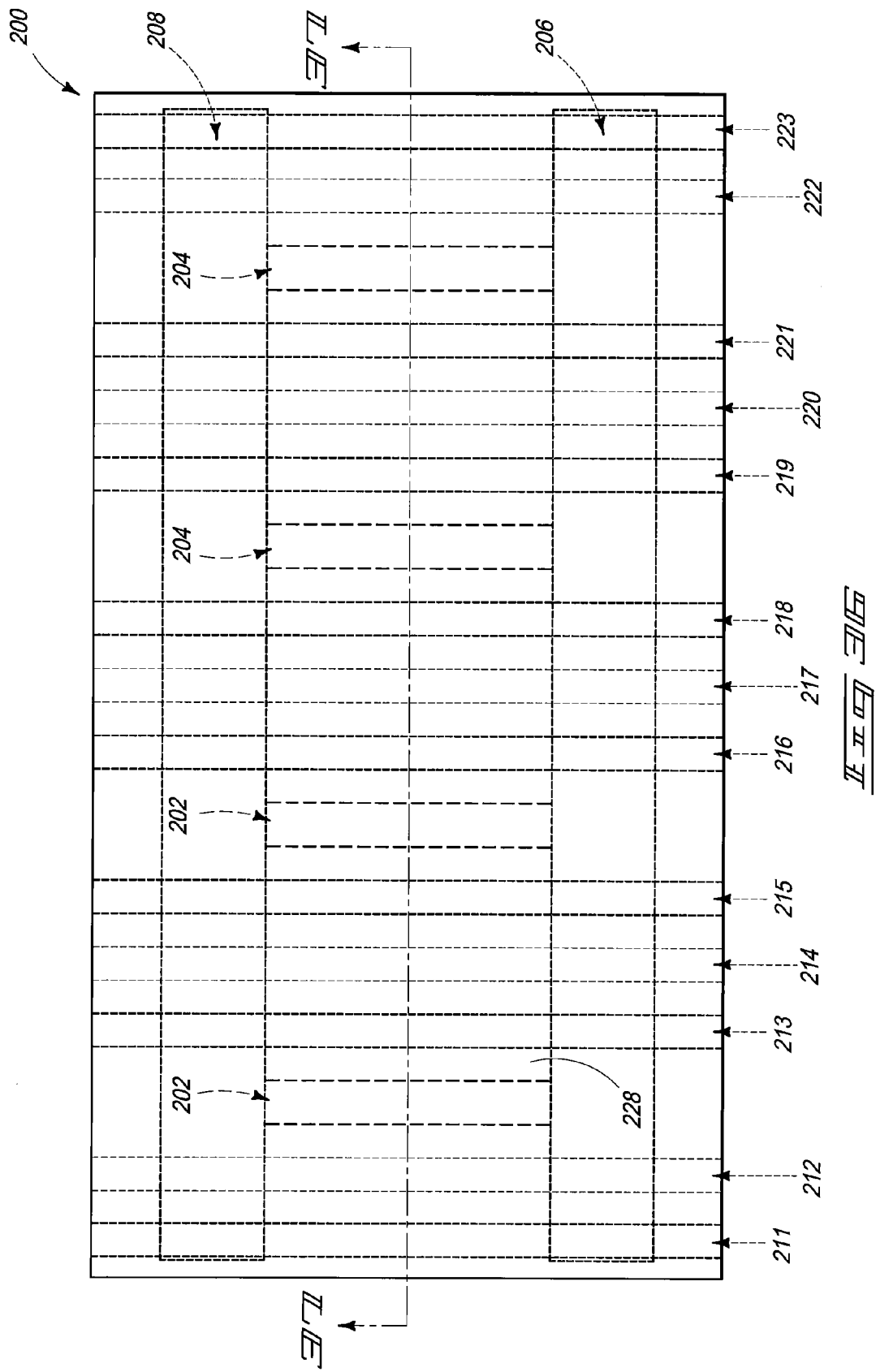
FIG. 36 is a diagrammatic top view of the construction of FIG. 32 shown at a processing stage subsequent to that of FIG. 35.

Referring to FIGS. 36 and 37, the copolymer is treated to induce self-assembly within such copolymer. The self-assembly converts the copolymer into two different domains. One of said domains is a plurality of structures 211-223, and the other of said domains is a substance 228 surrounding such structures. The structures 211-223 may be cylinders formed to extend parallel to a surface of substrate 12, and across the paired reservoirs 206 and 208 that are on opposing sides of such cylinders. The remaining portions of walls 202 and 204 may be considered to be weirs utilized during the self-assembly of the copolymer to orient structures 211-223 along a desired direction. Structures 211-223 are a plurality of parallel lines. In subsequent processing (not shown) such parallel lines may be utilized as a mask over the underlying substrate to create a pattern of spaced parallel features within such substrate.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a pattern, comprising:
    forming a main body of copolymer across a substantially planar upper surface of a substrate;
    inducing self-assembly of the copolymer within the main body to form a plurality of cylinders across the substrate; and
    while inducing the assembly of the cylinders from the copolymer, obtaining a pattern of the cylinders across the main body of the copolymer through fluid communication of the main body of copolymer with at least one reservoir of copolymer in a trench; the substantially planar upper surface of the substrate being outside of the trench; the trench extending primarily along a first horizontal direction, and having a sidewall; the cylinders extending primarily along a second horizontal direction which is substantially orthogonal to the first horizontal direction; the cylinders extending from the main body to across the sidewall and over the trench.

2. The method of claim 1 wherein the self-assembly is induced with at least one solvent vapor treatment.

3. The method of claim 1 wherein the self-assembly is induced with at least one thermal treatment.

4. A method of forming a pattern of structures across a region of an upper surface of a substrate, comprising:
    forming a trench in the substrate and recessed relative to the region of the upper surface where the pattern of the structures will be formed;
    forming copolymer across the substrate; a main body of the copolymer being across the region of the upper surface where the pattern of the structures will be formed, and a reservoir of the copolymer being within the trench and in fluid communication with the main body;
    inducing self-assembly of the copolymer within the main body to form the pattern of the structures across the region of the upper surface of the substrate; the pattern comprising linear structures that extend along the main body and overlap the trench;
    while inducing the self-assembly, maintaining a uniform thickness throughout the main body of the copolymer through utilization of the reservoir of copolymer; and
    utilizing the pattern of the structures across the region of the upper surface as a mask to pattern the underlying substrate while not using any structures induced within the copolymer within said trench for patterning the substrate.

5. The method of claim 4 wherein the copolymer comprises block copolymer.

6. The method of claim 4 wherein the copolymer comprises graft copolymer.

7. The method of claim 4 wherein the copolymer is within a blend containing two or more different block copolymers, a blend containing two or more different graft copolymers, a blend containing block copolymer and graft copolymer, a blend containing homopolymer and block copolymer, a blend containing homopolymer and graft copolymer, or a blend containing block copolymer and graft copolymer.

8. The method of claim 4 further comprising forming a wall around the trench and the region of the upper surface of the substrate; and wherein the uniform thickness is maintained through utilization of the wall in combination with the reservoir of copolymer.

9. The method of claim 4 wherein the self-assembly is induced with a thermal treatment.

10. The method of claim 4 wherein the self-assembly is induced with a solvent vapor treatment.

11. The method of claim 4 wherein the self-assembly is induced with multiple solvent vapor treatments that are sequentially-applied relative to one another.

12. The method of claim 4 wherein the self-assembly is induced with multiple thermal treatments that are sequentially-applied relative to one another.

13. A method of forming a pattern, comprising:
    forming at least one well in a substrate; the substrate having a substantially planar upper surface adjacent the well and outside of the well;
    providing copolymer across the substantially planar upper surface and within said at least one well;
    inducing self-assembly of the copolymer to form a pattern of structures across the substantially planar upper surface;
    while inducing the assembly of the structures from the copolymer, maintaining a uniform thickness throughout the copolymer across the substantially planar upper surface by fluid flow of copolymer between a region over the surface and a region within the well; the structures extending across the planar surface and overlapping the region within the well; and
    utilizing the pattern of structures formed over the substantially planar upper surface as a mask during patterning of the substrate.

14. The method of claim 13 wherein the structures assembled from the copolymer are cylinders aligned parallel to the substantially planar upper surface of the substrate; and wherein the at least one well is a pair of wells.

15. A method of forming a pattern, comprising:
    forming a plurality of walls over a planar surface of a substrate, each of said walls encircling a region of the substrate to define a walled-in region of the substrate;
    forming wells within the walled-in regions; the wells only consuming a portion of the walled-in regions, and leaving an area within each walled-in region that is outside of the wells and comprises the planar substrate surface; the areas within the walled-in regions that are outside of the wells comprising main body areas;
    providing copolymer within the walled-in regions, the copolymer extending across the main body areas and also being within the wells;
    inducing self-assembly of the copolymer to form patterns of annular structures across the main body areas of the walled-in regions, the annular structures extending across the main body areas and overlapping the wells;
    while inducing the self-assembly of the structures from the copolymer, maintaining a uniform thickness throughout the copolymer across the main body areas by fluid flow of copolymer between the main body areas and the wells; and using linear segments of the annular structures across the main body areas to pattern the underlying substrate.

16. The method of claim 15 wherein the walled-in regions are rectangular-shaped.

17. A method of forming a pattern, comprising:

forming a wall over a substrate, the wall encircling a region of the substrate to define walled-in region of the substrate; the substrate having a substantially planar upper surface;

forming a trench within the walled-in region of the substrate, the trench being elongated along a longitudinal direction, and being recessed below the substantially planar upper surface of the substrate;

forming a plurality of weirs within the walled-in region, the weirs being elongated along a direction substantially orthogonal to said longitudinal direction of the trench;

providing copolymer within the walled-in region and between the weirs;

inducing self-assembly of the copolymer to form patterns of structures between the weirs and along the substantially planar upper surface, the structures being aligned with the weirs, extending across the substantially planar upper surface, and overlapping the trench;

while inducing the self-assembly of the copolymer, maintaining a uniform thickness throughout the copolymer across the substantially planar upper surface by fluid flow of copolymer to and/or from the trench; and utilizing the structures along the substantially planar upper surface to pattern the substrate.

18. The method of claim 17 wherein the trench is one of a pair of trenches formed within the walled-in region, and wherein the structures extend between the trenches of said pair and overlap both of the trenches of said pair.

* * * * *